United States Patent
Terai

(10) Patent No.: US 10,522,595 B2
(45) Date of Patent: Dec. 31, 2019

(54) MEMORY DEVICES AND METHODS OF MANUFACTURING THE SAME

(71) Applicant: Samsung Electronics Co., Ltd., Suwon-si, Gyeonggi-do (KR)

(72) Inventor: Masayuki Terai, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 71 days.

(21) Appl. No.: 15/334,750

(22) Filed: Oct. 26, 2016

(65) Prior Publication Data

US 2017/0117328 A1    Apr. 27, 2017

(30) Foreign Application Priority Data

Oct. 27, 2015  (KR) .......... 10-2015-0149726

(51) Int. Cl.
*H01L 27/24* (2006.01)
*H01L 45/00* (2006.01)

(52) U.S. Cl.
CPC ...... *H01L 27/2481* (2013.01); *H01L 27/2427* (2013.01); *H01L 45/06* (2013.01); *H01L 45/126* (2013.01); *H01L 45/1233* (2013.01); *H01L 45/1266* (2013.01); *H01L 45/1675* (2013.01); *H01L 45/143* (2013.01); *H01L 45/144* (2013.01)

(58) Field of Classification Search
CPC ... H01L 27/10–1028; H01L 27/24–249; H01L 45/06–065; H01L 45/12–16; H01L 45/1641; H01L 45/1675; H01L 45/1233–124; H01L 27/2481
See application file for complete search history.

(56) References Cited

U.S. PATENT DOCUMENTS

| 8,237,143 | B2 | 8/2012 | Toda |
| 8,716,056 | B2 | 5/2014 | Parkinson |
| 8,735,861 | B2 | 5/2014 | Noda |
| 8,822,966 | B2 | 9/2014 | Takahashi et al. |
| 9,006,697 | B2 | 4/2015 | Oomachi et al. |
| 9,246,087 | B1 * | 1/2016 | Wang ............... H01L 45/12 |
| 2006/0278900 | A1 * | 12/2006 | Chang ............. H01L 45/04 257/248 |
| 2009/0017577 | A1 * | 1/2009 | An ................... H01L 27/2409 438/102 |
| 2009/0196091 | A1 | 8/2009 | Kau et al. |

(Continued)

FOREIGN PATENT DOCUMENTS

KR    10-1447813 B1    10/2014

OTHER PUBLICATIONS

N. Ciocchini, et al., "Universal Thermoelectric Characteristic in Phase Change Memories", 4 pages. IMW 2015.

*Primary Examiner* — Amar Movva
(74) *Attorney, Agent, or Firm* — Harness, Dickey & Pierce, P.L.C.

(57) ABSTRACT

A semiconductor device includes: a first memory cell, a bit line and a second memory cell. The first memory cell has a first stack structure including a first memory layer between a first heater electrode and a first ovonic threshold switching device. The bit line is on the first memory cell. The second memory cell is on the bit line, and has a second stack structure including a second memory layer between a second ovonic threshold switching device and a second heater electrode. The first and second stack structures are symmetrical with respect to the bit line.

18 Claims, 28 Drawing Sheets

(56) References Cited

U.S. PATENT DOCUMENTS

| | | | |
|---|---|---|---|
| 2010/0258782 A1* | 10/2010 | Kuse | H01L 45/146 |
| | | | 257/4 |
| 2010/0264393 A1* | 10/2010 | Mikawa | H01L 27/101 |
| | | | 257/2 |
| 2013/0148404 A1* | 6/2013 | Bandyopadhyay | |
| | | | G11C 11/5692 |
| | | | 365/103 |
| 2013/0256624 A1 | 10/2013 | Kau | |
| 2014/0061566 A1 | 3/2014 | Noda | |
| 2014/0217349 A1 | 8/2014 | Hopkins | |
| 2015/0155486 A1 | 6/2015 | Kuse et al. | |
| 2016/0260778 A1* | 9/2016 | Castro | H01L 27/2481 |

* cited by examiner

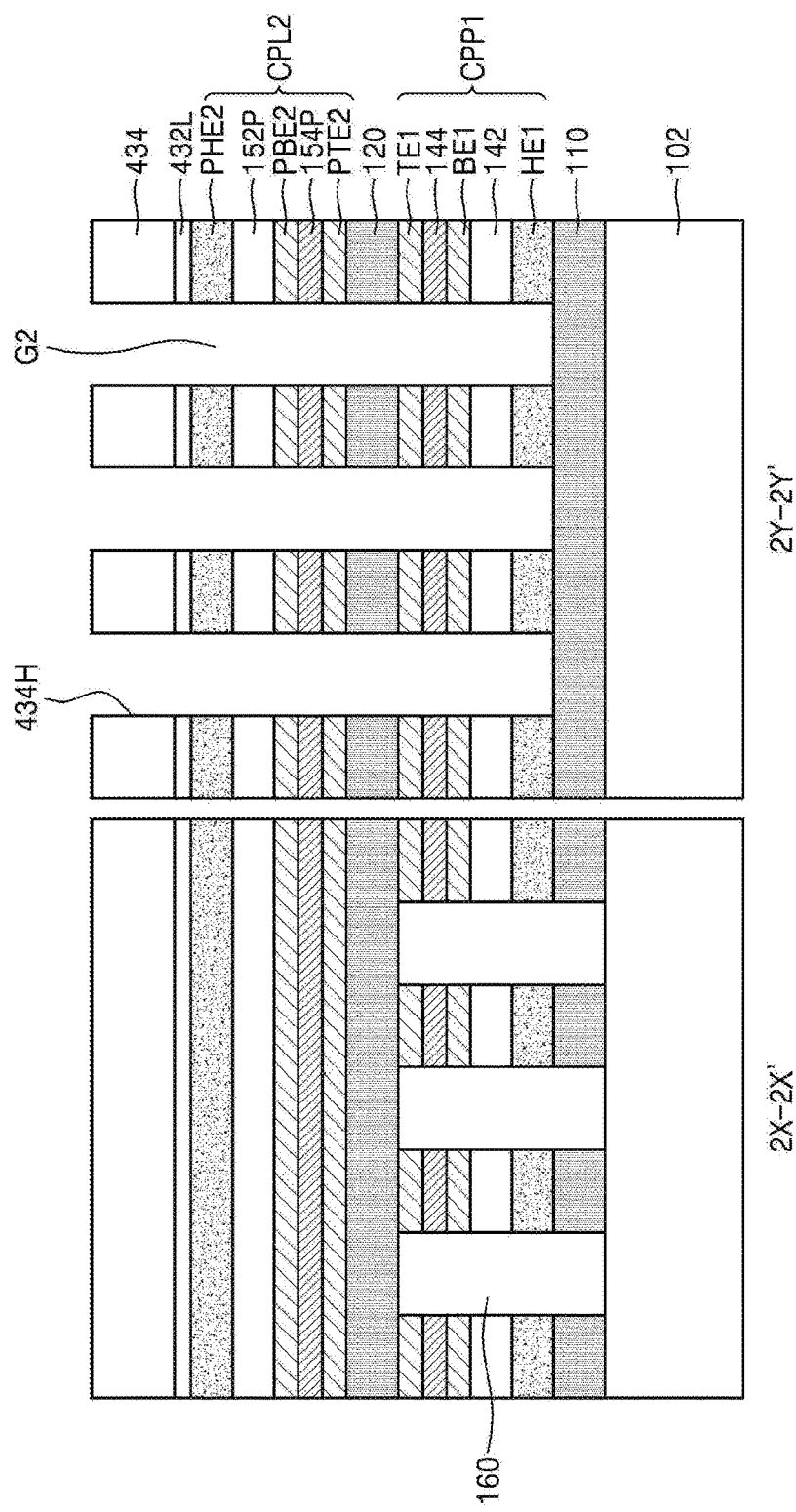

MEMORY DEVICES AND METHODS OF MANUFACTURING THE SAME

CROSS-REFERENCE TO RELATED APPLICATION

This application claim priority under 35 U.S.C. § 119 to Korean Patent Application No. 10-2015-0149726, filed on Oct. 27, 2015, in the Korean Intellectual Property Office, the disclosure of which is incorporated herein in its entirety by reference.

BACKGROUND

Field

Example embodiments of inventive concepts relate to memory devices and/or methods of manufacturing the same, and more particularly, to memory devices having cross-point array structures and/or methods of manufacturing the same.

Description of Related Art

There is a growing tendency to make electronic products more lightweight, thinner, and smaller. As a result, the demand for more highly integrated semiconductor devices has increased.

Memory devices having cross-point array structures in which memory cells are located at intersections between two electrodes crossing each other has been proposed for use in more highly integrated semiconductor devices. However, thicknesses of layers included in the memory device need to be reduced to downscale of memory devices having cross-point structures. Moreover, as layer thickness decreases, layers may more easily degrade and/or be damaged due to heat generated during operation, thereby deteriorating reliability of the memory device.

SUMMARY

Example embodiments of inventive concepts provide memory devices having cross-point array structures, which may have more uniform operation characteristics and/or improved reliability.

Example embodiments of inventive concepts also provide memory devices capable of increasing integration density and/or methods of manufacturing memory devices.

At least one example embodiment provides a memory device comprising: a plurality of lower word lines on a substrate, the plurality of lower word lines extending in a first direction parallel to a top surface of the substrate; a plurality of common bit lines on the plurality of lower word lines, the plurality of common bit lines extending in a second direction parallel to the top surface of the substrate, the second direction different from the first direction; a plurality of upper word lines on the plurality of common bit lines, the plurality of upper word lines extending in the first direction; a plurality of first memory cell structures at intersections between the plurality of lower word lines and the plurality of common bit lines, each of the plurality of first memory cell structures including a first memory layer and a first selection device, the first selection device having ovonic threshold switching (OTS) characteristics; and a plurality of second memory cell structures at intersections between the plurality of upper word lines and the plurality of common bit lines, each of the plurality of second memory cell structures including a second memory layer and a second selection device, the second selection device having OTS characteristics. The plurality of first memory cell structures have structures symmetrical to structures of the plurality of second memory cell structures with respect to the plurality of common bit lines in a third direction, and the third direction perpendicular to the first direction.

Each of the plurality of first memory cell structures may further include a first heater electrode; the first memory layer may be between the first heater electrode and the first selection device; each of the plurality of second memory cell structures may further include a second heater electrode; and the second memory layer may be between the second heater electrode and the second selection device.

The first heater electrode may not contact the first selection device, and the second heater electrode may not contact the second selection device.

The first heater electrode may contact the first memory layer, and the second heater electrode may contact the second memory layer.

A contact area between the first heater electrode and the first memory layer may be equal or substantially equal to a contact area between the second heater electrode and the second memory layer.

A first width of one of the first heater electrode and the first memory layer in the second direction may be less than a second width of another one of the first heater electrode and the first memory layer in the second direction. A third width of one of the second heater electrode and the second memory layer in the second direction may be less than a fourth width of another one of the second heater electrode and the second memory layer in the second direction.

The first heater electrode may have an I-shaped or a L-shaped vertical section.

The second heater electrode may have an I-shaped or a L-shaped vertical section.

The first memory layer may be on the first heater electrode, and the second memory layer may be under the second heater electrode. Alternatively, the first memory layer may be under the first heater electrode, and the second memory layer may be on the second heater electrode.

The first heater electrode, the first memory layer, and the first selection device of each of the plurality of first memory cell structures may overlap one another in a vertical direction. The second heater electrode, the second memory layer, and the second selection device of each of the plurality of second memory cell structures may overlap one another in the vertical direction.

At least one other example embodiment provides a memory device comprising: a plurality of first lower word lines on a substrate, the plurality of first lower word lines extending in a first direction parallel to a top surface of the substrate; a plurality of first common bit lines on the plurality of first lower word lines, the plurality of first common bit lines extending in a second direction parallel to the top surface of the substrate, the second direction different from the first direction; a plurality of first upper word lines on the plurality of first common bit lines, the plurality of first upper word lines extending in the first direction; a plurality of first memory cell structures at intersections between the plurality of first lower word lines and the plurality of first common bit lines, each of the plurality of first memory cell structures including a first memory layer and a first selection device, the first selection device having ovonic threshold switching (OTS) characteristics; and a plurality of second memory cell structures at intersections between the plurality of first upper word lines and the plurality of first common bit lines, each of the plurality of second memory cell structures including a second memory layer and a second selection device, the second selection device having OTS characteristics. The plurality of first memory cell structures have structures symmetrical to structures of the plurality of second memory cell structures with respect to the plurality of first common bit lines in a third direction, the third direction is perpendicular to the first direction, and a first sidewall of a first of the plurality of first memory cell structures is aligned with a first sidewall of a first of the plurality of second memory cell structures.

The first sidewall of the first of the plurality of first memory cell structures may be aligned with a longitudinal sidewall of a first of the plurality of first common bit lines.

The first sidewall of the first of the plurality of second memory cell structures may be aligned with a longitudinal sidewall of a first of the plurality of first common bit lines.

The first sidewall of the first of the plurality of first memory cell structures may be aligned with a longitudinal sidewall of a first of the plurality of first lower word lines.

The first sidewall of the first of the plurality of second memory cell structures may be aligned with a longitudinal sidewall of a first of the plurality of first upper word lines.

A first sidewall of a first selection device among the first selection devices may be aligned with a longitudinal sidewall of a first of the plurality of first lower word lines. A second sidewall of the first selection device among the first selection devices may be aligned with a longitudinal sidewall of a first of the plurality of first common bit lines.

A first sidewall of a second selection device among the second selection devices may be aligned with a longitudinal sidewall of a first of the plurality of first upper word lines. A second sidewall of the second selection device among the second selection devices may be aligned with a longitudinal sidewall of a first of the plurality of first common bit lines.

Each of the plurality of first memory cell structures may further include a first heater electrode; the first memory layer may be between the first heater electrode and the first selection device; each of the plurality of second memory cell structures may further include a second heater electrode; and the second memory layer may be between the second heater electrode and the second selection device.

The first selection device may not contact the first heater electrode, and the second selection device may not contact the second heater electrode.

The memory device may further include: a plurality of second lower word lines on the plurality of first upper word lines, the plurality of second lower word lines extending in the first direction; a plurality of second common bit lines on the plurality of second lower word lines, the plurality of second common bit lines extending in the second direction; a plurality of second upper word lines on the plurality of second common bit lines, the plurality of second upper word lines extending in the first direction; a plurality of third memory cell structures at intersections between the plurality of second lower word lines and the plurality of second common bit lines, each of the plurality of third memory cell structures having a third memory layer and a third selection device, the third selection device having OTS characteristics; and a plurality of fourth memory cell structures at intersections between the plurality of second upper word lines and the plurality of second common bit lines, each of the plurality of fourth memory cell structures including a fourth memory layer and a fourth selection device, the fourth selection device having OTS characteristics.

A sidewall of a first of the plurality of third memory cell structures may be aligned with a sidewall of a first of the plurality of fourth memory cell structures.

At least one other example embodiment provides a method of manufacturing a memory device, the method comprising: forming a first stack structure by sequentially stacking a lower word line layer, a first preliminary memory layer, and a first preliminary selection device layer on a substrate; forming a plurality of lower word lines and a plurality of first stack lines by patterning the first stack structure, wherein the plurality of lower word lines and the plurality of first stack lines extend in a first direction parallel to a top surface of the substrate; forming a second stack structure by sequentially stacking a common bit line layer, a second preliminary selection device layer, and a second preliminary memory layer on the plurality of first stack lines; forming a plurality of first memory cell structures, a plurality of common bit lines, and a plurality of second stack lines by patterning the plurality of first stack lines and the second stack structure, wherein the plurality of common bit lines and the plurality of second stack lines extend in a second direction, the second direction different from the first direction; forming an upper word line layer on the plurality of second stack lines; and forming a plurality of second memory cell structures and a plurality of upper word lines by patterning the plurality of second stack lines and the upper word line layer, wherein the plurality of upper word lines extend in the first direction.

The forming a plurality of first memory cell structures, a plurality of common bit lines, and a plurality of second stack lines may include patterning the plurality of first stack lines to expose top surfaces of the plurality of lower word lines.

The forming a plurality of second memory cell structures and a plurality of upper word lines may include patterning the plurality of second stack lines to expose top surfaces of the plurality of common bit lines.

Structures of the plurality of first memory cell structures and structures of the plurality of second memory cell structures may be symmetrical with respect to the plurality of common bit lines in a third direction. The third direction may be perpendicular to a top surface of the substrate.

A sidewall of a first of the plurality of first memory cell structures may be aligned with a sidewall of a first of the plurality of second memory cell structures.

The method may further include: forming a first insulating layer between two adjacent lower word lines among the plurality of lower word lines and two adjacent first stack lines among the plurality of first stack lines; forming a second insulating layer between two adjacent common bit lines among the plurality of common bit lines and between two adjacent second stack lines among the plurality of second stack lines; and forming a third insulating layer between two adjacent upper word lines among the plurality of upper word lines.

At least one other example embodiment provides a semiconductor device comprising: a first memory cell, a bit line and a second memory cell. The first memory cell has a first stack structure including a first memory layer between a first heater electrode and a first ovonic threshold switching device. The bit line is on the first memory cell. The second memory cell is on the bit line, and has a second stack structure including a second memory layer between a second ovonic threshold switching device and a second heater electrode. The first and second stack structures are symmetrical with respect to the bit line.

The first stack structure may be a vertical stack structure; the first memory layer may be on the first heater electrode; and the first ovonic threshold switching device may be on the first memory layer and contacts the bit line.

The second stack structure may be a vertical stack structure; the second ovonic threshold switching device may contact the bit line; the second memory layer may be on the second ovonic threshold switching device; and the second heater electrode may be on the second memory layer.

The first stack structure may be a vertical stack structure; the first memory layer may be on the first ovonic threshold switching device; and the first heater electrode may be on the first memory layer and contacts the bit line.

The second stack structure may be a vertical stack structure; the second heater electrode may contact the bit line; the second memory layer may be on the second heater electrode; and the second ovonic threshold switching device may be on the second memory layer.

The memory device may further include: a first word line connected to the first heater electrode; and a second word line connected to the second heater electrode.

The first memory layer may be a first phase-change material layer, and the first heater electrode may be configured to heat the first phase-change material layer to change the phase of the first phase-change material layer.

The second memory layer may be a second phase-change material layer, and the second heater electrode may be configured to heat the second phase change material layer to change the phase of the second phase-change material layer.

The first memory layer may separate the first heater electrode from the first ovonic threshold switching device such that the first heater electrode does not contact the first ovonic threshold switching device.

The second memory layer may separate the second heater electrode from the second ovonic threshold switching device such that the second heater electrode does not contact the second ovonic threshold switching device.

BRIEF DESCRIPTION OF THE DRAWINGS

Example embodiments of inventive concepts will be more clearly understood from the following detailed description taken in conjunction with the accompanying drawings in which:

FIGS. 16A to 16M are cross-sectional views of process operations of a method of manufacturing a memory device according to an example embodiment.

DETAILED DESCRIPTION

Figure 1:
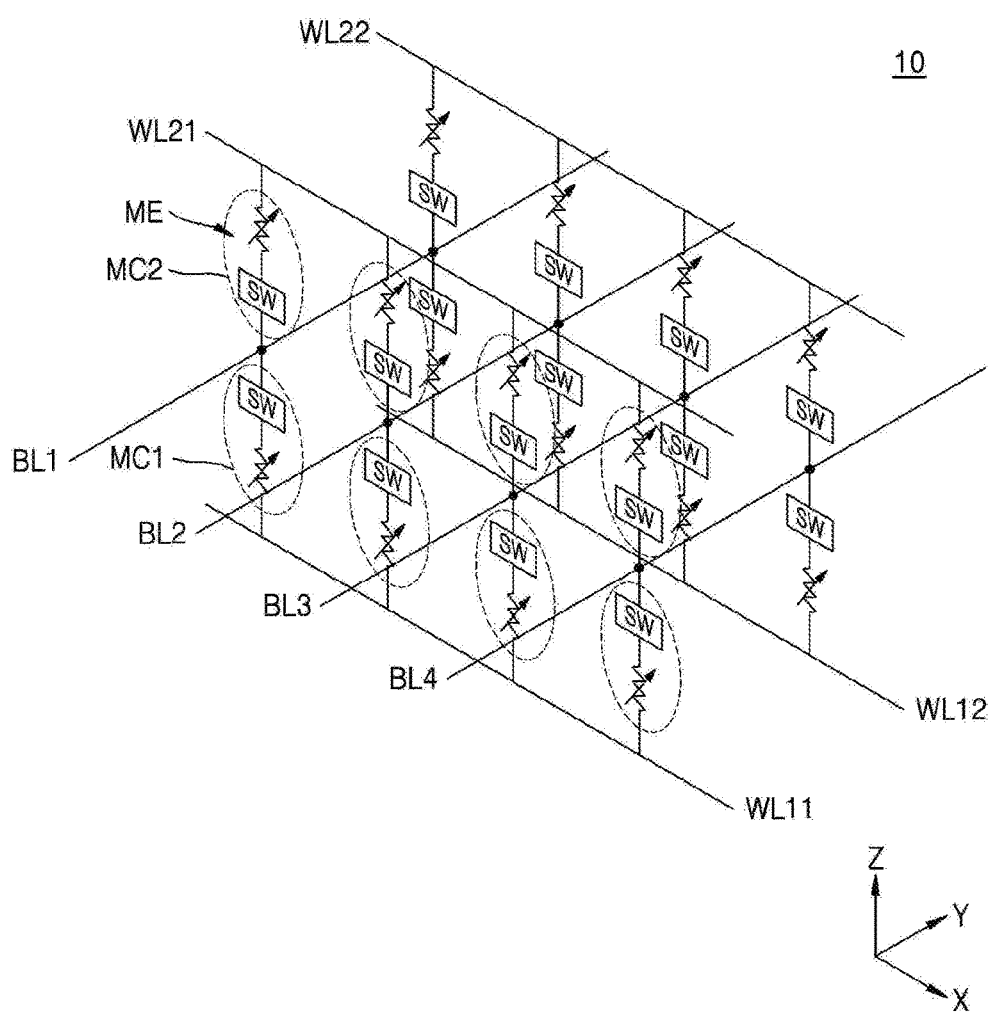
FIG. 1 is an equivalent circuit diagram of a memory device according to an example embodiment.

Various example embodiments will be described more fully hereinafter with reference to the accompanying drawings, in which some example embodiments are shown. The example embodiments may, however, be embodied in many different forms and should not be construed as limited to the example embodiments set forth herein. Rather, these example embodiments are provided so that this description will be thorough and complete, and will fully convey the scope of the example embodiments to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the example embodiments.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Unless otherwise defined, all terms (including technical and scientific terms) used herein have the same meaning as commonly understood by one of ordinary skill in the art to which this example embodiment belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Example embodiments of inventive concepts explained and illustrated herein include their complementary counterparts. The same reference numerals or the same reference designators denote the same elements throughout the specification.

FIG. 1 is an equivalent circuit diagram of a memory device 10 according to an example embodiment.

Referring to FIG. 1, the memory device 10 may include lower word lines WL11 and WL12, which may extend in a first direction (e.g., X direction in FIG. 1) and be spaced apart from each other in a second direction (e.g., Y direction in FIG. 1) perpendicular or substantially perpendicular to the first direction, and upper word lines WL21 and WL22, which may extend in the first direction and be spaced apart from each other in a third direction (e.g., Z direction in FIG. 1) perpendicular or substantially perpendicular to the first direction on the lower word lines WL11 and WL12. Also, the memory device 10 may include common bit lines BL1, BL2, BL3, and BL4, which may extend in the second direction and be spaced apart from each of the upper word lines WL21 and WL22 and the lower word lines WL11 and WL12 in the third direction.

The first and second memory cells MC1 and MC2 may be respectively located between the common bit lines BL1, BL2, BL3, and BL4 and the lower word lines WL11 and WL12 and between the common bit lines BL1, BL2, BL3, and BL4 and the upper word lines WL21 and WL22. Specifically, the first memory cell MC1 may be located at an intersection between the common bit lines BL1, BL2, BL3, and BL4 and the lower word lines WL11 and WL12 and include a memory layer ME configured to store information and a selection device SW configured to select a memory cell. Also, the second memory cell MC2 may be located at an intersection between the common bit lines BL1, BL2, BL3, and BL4 and the upper word lines WL21 and WL22 and include a memory layer ME configured to store information and a selection device SW configured to select a memory cell.

The first memory cell MC1 and the second memory cell MC2 may have structures that are symmetrical to each other with respect to the common bit lines BL1, BL2, BL3, and BL4 in the third direction. As shown in FIG. 1, in the first memory cell MC1 located between the lower word line WL11 and the common bit line BL1, the memory layer ME may be electrically connected to the lower word line WL11, the selection device SW may be electrically connected to the common bit line BL1, and the memory layer ME and the selection device SW may be connected in series. Also, in the second memory cell MC2 located between the upper word line WL21 and the common bit line BL1, the memory layer ME may be electrically connected to the upper word line WL21, the selection device SW may be electrically connected to the common bit line BL1, and the memory layer ME and the selection device SW may be connected in series. However, inventive concepts are not limited thereto. Unlike shown in FIG. 1, in the first memory cell MC1, the selection device SW may be directly connected to the lower word line WL11, and the memory layer ME may be directly connected to the common bit line BL1. Also, in the second memory cell MC2, the selection device SW may be directly connected to the upper word line WL21, and the memory layer ME may be directly connected to the common bit line BL2. Thus, the first memory cell MC1 and the second memory cell MC2 may be located symmetrically to each other with respect to the common bit line BL1.

Hereinafter, an example embodiment of a method of operating the memory device 10 will be described.

For example, a voltage may be applied to the memory layer ME of the first memory cell MC1 or the second memory cell MC2 through the word lines WL11, WL12, WL21, and WL22 and the common bit lines BL1, BL2, BL3, and BL4 so that current may flow into the memory layer ME. For example, the memory layer ME may include a phase-change material layer, which may be reversibly transitioned between a first state and a second state. However, the memory layer ME is not limited thereto, and the memory layer ME may include any variable resistor of which a resistance varies according to an applied voltage. For example, a resistance of the memory layer ME may be reversibly transitioned between the first state and the second state in response to a voltage applied to the memory layer ME of one selected out of the memory cells MC1 and MC2.

Digital data, such as "0" or "1", may be stored in the first and second memory cells MC1 and MC2 or erased from the first and second memory cells MC1 and MC2 depending on a change in resistance of the memory layer ME. For example, a high-resistance state "0" and a low-resistance state "1" may be written as data in the first and second memory cells MC1 and MC2. Here, example operation of changing a high-resistance state "0" into a low-resistance state "1" may be referred to as a "set operation", and an operation of changing a low-resistance state "1" into a high-resistance state "0" may be referred to as a "reset operation". However, digital data stored in the first and second memory cells MC1 and MC2 according to an example embodiment are not limited to the high-resistance state "0" and the low-resistance state "1", but various resistance states may be stored in the first and second memory cells MC1 and MC2.

An arbitrary one of the first and second memory cells MC1 and MC2 may be addressed by selecting the lower and upper word lines WL11, WL12, WL21, and WL22 and the common bit lines BL1, BL2, BL3, and BL4. Also, by applying a given (or, alternatively, desired or predetermined) signal between the lower and upper word lines WL11, WL12, WL21, and WL22 and the common bit lines BL1, BL2, BL3, and BL4, the first and second memory cells MC1 and MC2 may be programmed, and current may be measured through the common bit lines BL1, BL2, BL3, and BL4 so that information corresponding to a resistance of a variable resistor included in the corresponding one of the first and second memory cells MC1 and MC2 may be read.

Figure 2:
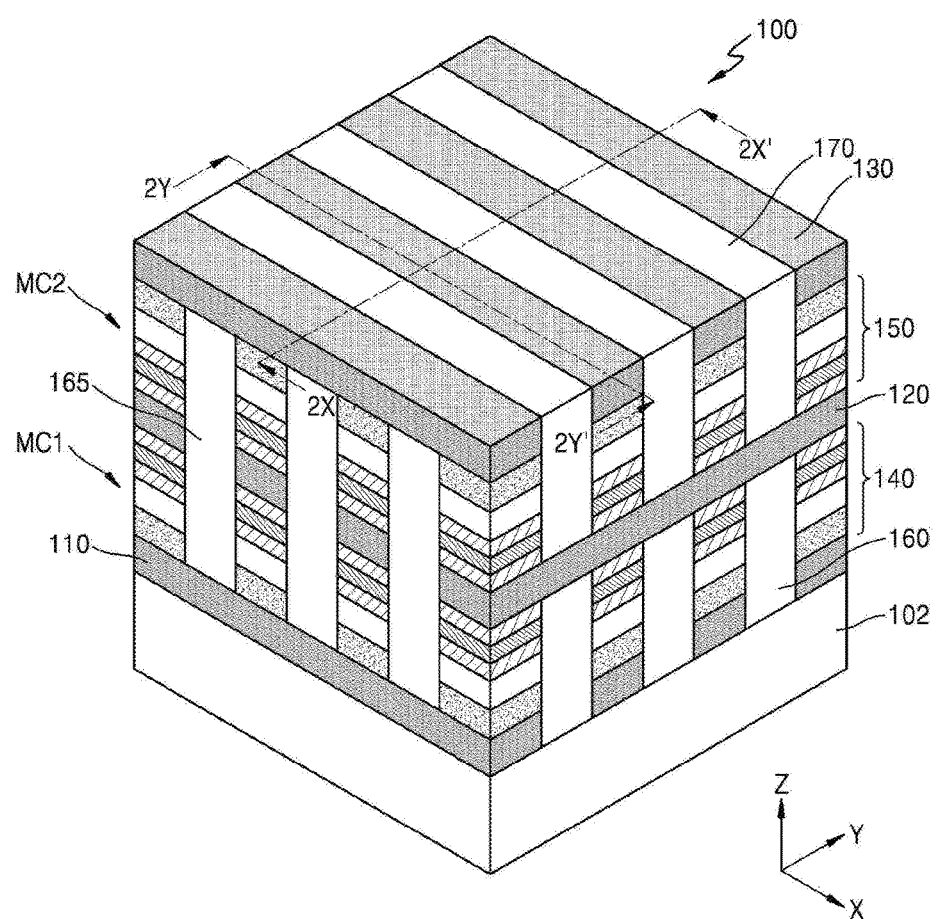
FIG. 2 is a perspective view of a memory device according to an example embodiment.
Figure 3:
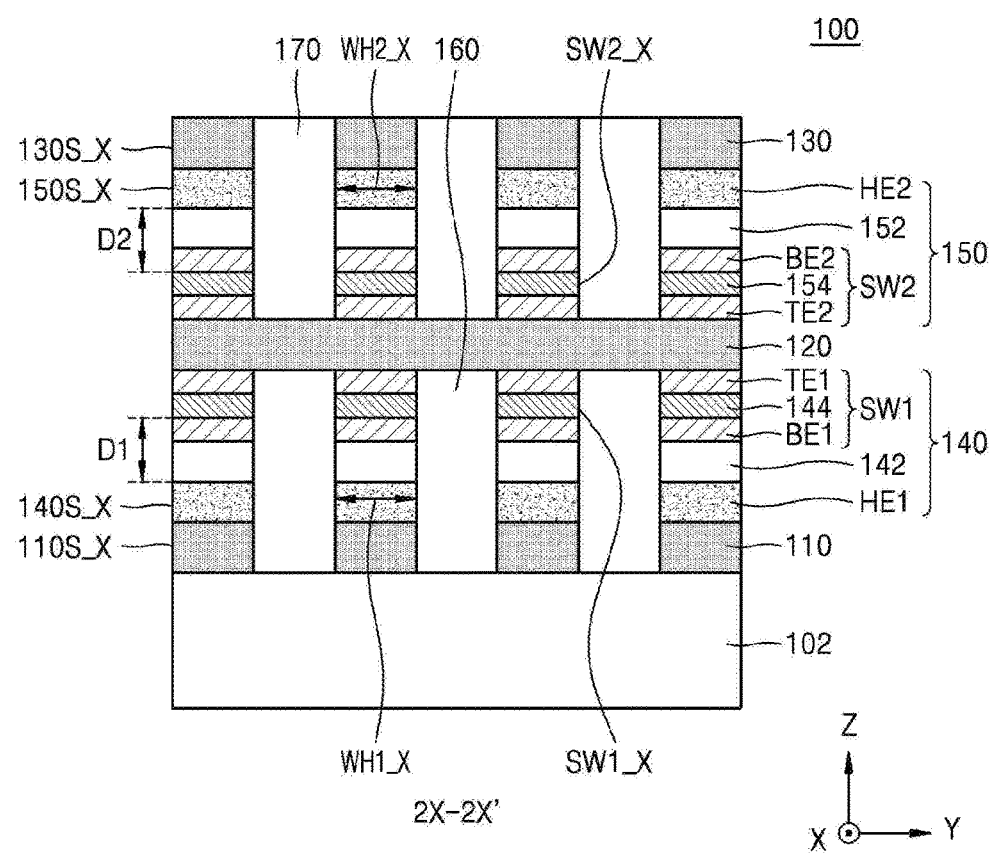
FIG. 3 is a cross-sectional view taken along a line 2X-2X' of FIG. 2.
Figure 4:
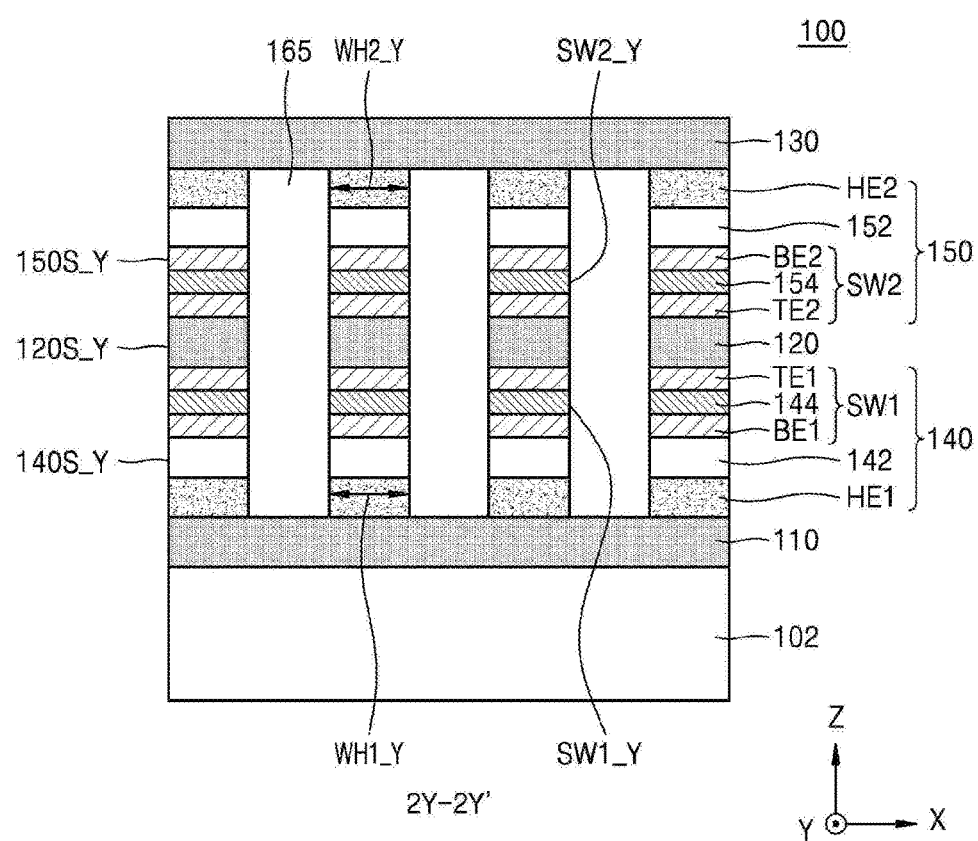
FIG. 4 is a cross-sectional view taken along a line 2Y-2Y' of FIG. 2.

FIG. 2 is a perspective view of a memory device 100 according to an example embodiment, and FIG. 3 is a cross-sectional view taken along a line 2X-2X' of FIG. 2. FIG. 4 is a cross-sectional view taken along a line 2Y-2Y' of FIG. 2.

Referring to FIGS. 2 to 4, the memory device 100 may include a plurality of lower word lines 110, which may extend on a substrate 102 parallel or substantially parallel to one another in a first direction (X direction in FIG. 2), a plurality of common bit lines 120, which may extend parallel or substantially parallel to one another in a second direction (Y direction in FIG. 2) perpendicular or substantially perpendicular to the first direction, and a plurality of upper word lines 130, which may extend parallel or substantially parallel to one another in the first direction.

Each of the plurality of lower word lines 110, the plurality of common bit lines 120, and the plurality of upper word lines 130 may include a metal, conductive metal nitride, conductive metal oxide, or a combination thereof. In example embodiments, each of the plurality of lower word lines 110, the plurality of common bit lines 120, and the plurality of upper word lines 130 may include tungsten (W), tungsten nitride (WN), gold (Au), silver (Ag), copper (Cu), aluminum (Al), titanium aluminum nitride (TiAlN), iridium (Jr), platinum (Pt), palladium (Pd), ruthenium (Ru), zirconium (Zr), rhodium (Rh), nickel (Ni), cobalt (Co), chromium (Cr), tin (Sn), zinc (Zn), indium tin oxide (ITO), an alloy thereof, or a combination thereof. In example embodiments, each of the plurality of lower word lines 110, the plurality of common bit lines 120, and the plurality of upper word lines 130 may include a metal layer and a conductive barrier layer covering at least a portion of the metal layer. The conductive barrier layer may include, for example, titanium (Ti), titanium nitride (TiN), tantalum (Ta), tantalum nitride (TaN), or a combination thereof.

Each of the plurality of lower word lines 110 that may extend in the first direction may intersect each of the plurality of common bit lines 120 that may extend in the second direction. A plurality of first memory cells MC1 may be located at a plurality of intersections between the plurality of lower word lines 110 and the plurality of common bit lines 120, respectively.

The plurality of first memory cells MC1 may include a plurality of first memory cell pillars 140, respectively. A plurality of insulating patterns 160 may be respectively interposed between first memory cell pillars 140, which may be arranged in a row in the second direction (Y direction) from among the plurality of first memory cell pillars 140.

Each of the plurality of first memory cell pillars 140 may include a first memory layer 142, a first heater electrode HE1, and a first selection device SW1.

In example embodiments, the first memory layer 142 may include a phase-change material. For example, a phase of the first memory layer 142 may be reversibly changed due to Joule heat generated by a voltage applied to both ends of the first memory layer 142, and the first memory layer 142 may include a material of which a resistance may be changed due to a change in phase of the first memory layer 142. For example, the phase-change material may be put into a high-resistance state in an amorphous phase and put into a low-resistance state in a crystalline phase. Data may be stored in the first memory layer 142 by defining the high-resistance state as data "0" and defining the low-resistance state as data "1".

In example embodiments, the first memory layer 142 may include at least one selected from the group including tellurium (Te), selenium (Se), germanium (Ge), antimony (Sb), bismuth (Bi), lead (Pb), tin (Sn), indium (In), silver (Ag), arsenic (As), sulfur (S), phosphorus (P), and a mixture thereof. For example, the first memory layer 142 may include at least one of chalcogenides, such as GeSbTe, GeTeAs, GeBiTe, GeTeTi, GeTeSe, AsSbTe, SnSbTe, SeTeSn, SbSeBi, SnSbBi, GaTeSe, InSbTe, TaSbTe, VSbTe, TaSbSe, NbSbSe, VSbSe, WSbTe, MoSbTe, CrSbTe, WSbSe, MoSbSe, CrSbSe, GeTe, InSe, SbTe, InSnSbTe, AgInSbTe, and AsGeSbTe. In other example embodiments, the first memory layer 142 may include a chalcogenide doped with impurities. The impurities may include, for example, nitrogen (N), oxygen (O), silicon (Si), carbon (C), boron (B), dysprosium (Dy), or a combination thereof, but a material included in the first memory layer 142 is not limited thereto.

The first heater electrode HE1 may be located between the plurality of lower word lines 110 and the first memory layer 142. The first heater electrode HE1 may include a conductive material that may not react with the first memory layer 142, but generate sufficient heat to change a phase of the first memory layer 142. In example embodiments, the first heater electrode HE1 may include a relatively high-melting-point metal or a nitride thereof, such as titanium nitride (TiN), titanium silicon nitride (TiSiN), titanium aluminum nitride (TiAlN), tantalum silicon nitride (TaSiN), tantalum aluminum nitride (TaAlN), tantalum nitride (TaN), tungsten silicide (WSi), tungsten nitride (WN), titanium tungsten (TiW), molybdenum nitride (MoN), niobium nitride (NbN), titanium boron nitride (TiBN), zirconium silicon nitride (ZrSiN), tungsten silicon nitride (WSiN), tungsten boron nitride (WBN), zirconium aluminum nitride (ZrAlN), molybdenum aluminum nitride (MoAlN), titanium aluminide (TiAl), titanium oxynitride (TiON), titanium aluminum oxynitride (TiAlON), tungsten oxynitride (WON), tantalum oxynitride (TaON), or a combination thereof. However, a material included in the first heater electrode HE1 is not limited thereto.

The first selection device SW1 may include a first lower electrode BE1, a first selection device layer 144, and a first upper electrode TE1, which are stacked sequentially. The first selection device SW1 may be a current adjusting device configured to adjust the flow of current. The first selection device SW1 may be, for example, a current adjusting device having ovonic threshold switching (OTS) characteristics.

The first selection device layer 144 may include a material of which a resistance may vary according to a magnitude of a voltage applied to both ends of the first selection device layer 144. For example, the first selection device layer 144 may include a material having OTS characteristics. For example, when a voltage lower than a threshold voltage $V_T$ is applied to the first selection device layer 144, the first selection device layer 144 may be in a high-resistance state. When a voltage higher than the threshold voltage $V_T$ is applied to the first selection device layer 144, the first selection device layer 144 may be in a low-resistance state and current may start to flow through the first selection device layer 144. Also, when current flowing through the first selection device layer 144 becomes smaller than a holding current, the first selection device layer 144 may be changed into a high-resistance state. Meanwhile, the OTS characteristics of the first selection device layer 144 will be described in detail later with reference to FIG. 6.

In example embodiments, the first selection device layer 144 may include at least one selected from the group including tellurium (Te), selenium (Se), germanium (Ge), arsenic (As), silicon (Si), and a mixture thereof. For example, the first selection device layer 144 may include AsSe, AsSeGe, AsSeGeTe, and/or AsGeTeSi. In other example embodiments, the first selection device layer 144 may be further doped with impurities, for example, nitrogen (N), oxygen (O), carbon (C), boron (B), and dysprosium (Dy). However, a material included in the first selection device layer 144 is not limited thereto.

Each of the first lower electrode BE1 and the first upper electrode TE1 may include a metal, a conductive metal nitride, a conductive metal oxide, or a combination thereof. For example, each of the first lower electrode BE1 and the first upper electrode TE1 may include a TiN layer, but inventive concepts are not limited thereto. In example embodiments, each of the first lower electrode BE1 and the first upper electrode TE1 may include a conductive layer including a metal or a conductive metal nitride and at least one conductive barrier layer covering at least a portion of the conductive layer. The conductive barrier layer may include a metal oxide, a metal nitride, or a combination thereof, but is not limited thereto.

FIGS. 2 to 4 illustrate an example in which the first lower electrode BE1 is in contact with the first memory layer 142 and is under the first selection device layer 144, and the first upper electrode TE1 is in contact with the plurality of common bit lines 120 and is on the first selection device layer 144. However, inventive concepts are not limited thereto. Unlike shown in FIGS. 2 to 4, the first upper electrode TE1 may be located under the first selection device layer 144, and the first lower electrode BE1 may be located on the first selection device layer 144.

As shown in FIG. 3, the first memory layer 142 may be interposed between the first selection device SW1 and the first heater electrode HE1. That is, for example, the first selection device SW1 and the first heater electrode HE1 may be located at both ends of the first memory cell pillar 140, and the first selection device SW1 may not be in direct contact with the first heater electrode HE1. Accordingly, a relatively large first distance D1 may be ensured between the first selection device layer 144 and the first heater electrode HE1. For example, the first distance D1 may be about 10 nm to about 100 nm, but inventive concepts are not limited thereto. The first distance D1 may vary according to thicknesses of the first memory layer 142, the first lower electrode BE1, and/or the first upper electrode TE1 in a third direction (Z direction in FIG. 2).

In general, when the first selection device layer 144 includes a material having OTS characteristics, the first selection device layer 144 may include an amorphous chalcogenide material. However, since there is a tendency to downscale memory devices, thicknesses and widths of the first heater electrode HE1, the first memory layer 142, the first selection device layer 144, the first upper electrode TE1, and/or the first lower electrode BE1 and distances there between may be reduced. Accordingly, during a process of operating the memory device 100, when a phase of the first memory layer 142 is changed due to heat generated by the first heater electrode HE1, the first selection device layer 144 located adjacent to the first memory layer 142 may also be affected by the generated heat. For instance, the first selection device layer 144 may be degraded or damaged. For example, the first selection device layer 144 may be partially crystallized due to heat generated by the first heater electrode HE1 adjacent to the first selection device layer 144. However, in example embodiments, since the relatively large first distance D1 is ensured between the first selection device layer 144 and the first heater electrode HE1, degradation of and/or damage to the first selection device layer 144 may be suppressed and/or prevented.

A plurality of second memory cells MC2 may be located at a plurality of intersections between the plurality of common bit lines 120 and the plurality of upper word lines 130.

The plurality of second memory cells MC2 may include a plurality of second memory cell pillars 150. A plurality of insulating lines 170, which may extend in a second direction (Y direction), may be respectively interposed between second memory cell pillars 150, which are arranged in a row in the second direction from among the plurality of second memory cell pillars 150.

Each of the second memory cell pillars 150 may include a second memory layer 152, a second heater electrode HE2, and a second selection device SW2. The second selection device SW2 may include a second upper electrode TE2, a second selection device layer 154, a second lower electrode BE2, which may be stacked sequentially. The second selection device SW2 may be located on the plurality of common bit lines 120, and the second memory layer 152 may be located on the second selection device SW2. Also, the second heater electrode HE2 may be located between the second memory layer 152 and the plurality of upper word lines 130.

Meanwhile, the second upper electrode TE2, the second selection device layer 154, the second lower electrode BE2, the second memory layer 152, and the second heater electrode HE2 may have characteristics similar or substantially similar to the above-described first upper electrode TE1, first selection device layer 144, first lower electrode BE1, first memory layer 142, and first heater electrode HE1, respectively, detailed descriptions thereof are omitted.

As shown in FIGS. 2 and 3, the plurality of first memory cell pillars 140 may be located symmetrically to the plurality of first memory cell pillars 140 with respect to the common bit line 120 in the third direction (Z direction in FIG. 2). That is, for example, the first selection device SW1 and the second selection device SW2 may be respectively located under and on the common bit line 120. The first selection device SW1, the first memory layer 142, and the first heater electrode HE1 may be sequentially located downward from the common bit line 120 in the plurality of first memory cell pillars 140, while the second selection device SW2, the second memory layer 152, and the second heater electrode HE2 may be sequentially located upward from the common bit line 120 in the plurality of second memory cell pillars 150.

Since the plurality of first memory cell pillars 140 are located symmetrically to the plurality of second memory cell pillars 150 with respect to the common bit lines 120, the first memory cell MC1 and the second memory cell MC2 may have more uniform operating characteristics, which will be described by using example ion migration paths in memory cells 50A and 50B shown in FIG. 5.

Figure 5:
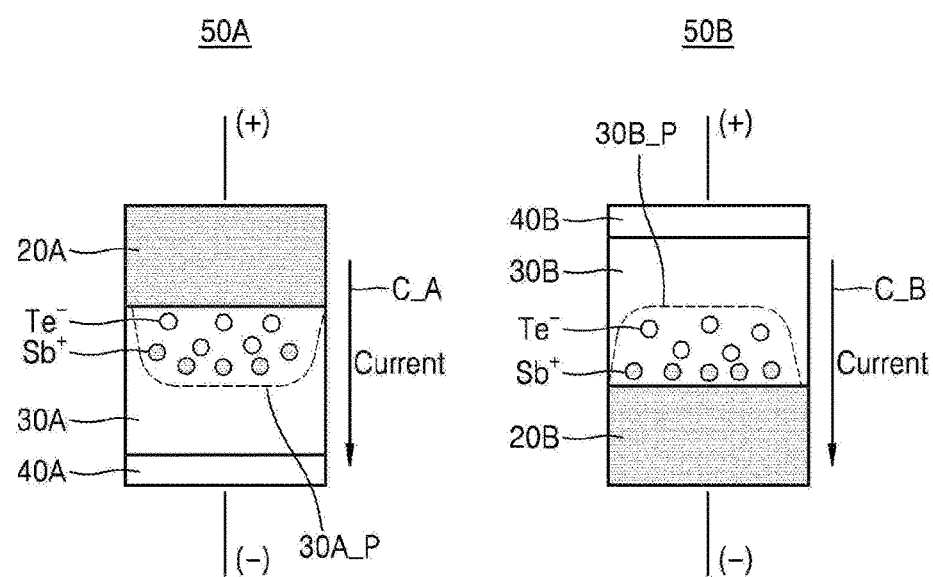
FIG. 5 is a schematic diagram of example ion migration paths of memory layers in response to voltages applied to memory cells.

FIG. 5 is a schematic diagram of example ion migration paths of memory layers 30A and 30B in response to voltages applied to the memory cells 50A and 50B.

Referring to FIG. 5, the memory cell 50A may include a first electrode 20A, a memory layer 30A, and a second electrode 40A that are stacked sequentially. The first electrode 20A may include a conductive material capable of generating sufficient heat to change a phase of the memory layer 30A, and correspond to the heater electrodes HE1 and HE2 (refer to FIG. 2). In the memory cell 50A, a positive voltage may be applied to the first electrode 20A, and a negative voltage may be applied to the second electrode 40A so that current may flow from the first electrode 20A through the memory layer 30A to the second electrode 40A as indicated by an arrow C_A.

Heat may be generated in the first electrode 20A due to current flowing through the first electrode 20A, and thus, a phase change may occur in a portion 30A_P of the memory layer 30A adjacent to an interface between the first electrode 20A and the memory layer 30A. For example, in a "reset" operation of changing the portion 30A_P of the memory layer 30A from a crystalline state (e.g., low-resistance state) to an amorphous state (e.g., a high-resistance state), positive ions and negative ions in the portion 30A_P may diffuse at different rates due to the applied voltages. As shown in a left portion of FIG. 5, a diffusion rate of positive ions (e.g., antimony ions (Sb+)) may be higher than a diffusion rate of negative ions (e.g., tellurium ions (Te−)) in the portion 30A_P of the memory layer 30A. Accordingly, the antimony ions may diffuse toward the second electrode 40A to which a negative voltage is applied, in a larger amount than the tellurium ions. For example, a rate at which the antimony ions diffuse toward the second electrode 40A may be higher than a rate at which the tellurium ions diffuse toward the first electrode 20A.

On the other hand, the memory cell 50B may include a first electrode 20B, a memory layer 30B, and a second electrode 40B. A negative voltage may be applied to the first electrode 20B and a positive voltage may be applied to the second electrode 40B so that current may flow from the second electrode 40B through the memory layer 30A to the first electrode 20B as indicated by an arrow C_B.

Heat may be generated in the first electrode 20B due to current flowing through the first electrode 20B, and thus, a phase change may occur in a portion 30B_P of the memory layer 30B adjacent to an interface between the first electrode 20B and the memory layer 30B. In this case, as shown in a right portion of FIG. 5, a diffusion rate of antimony ions is higher than a diffusion rate of tellurium ions in the portion 30B_P of the memory layer 30A, and antimony ions may diffuse toward the first electrode 20B to which the negative voltage is applied, in a larger amount than the tellurium ions.

Accordingly, as compared with the memory cell 50A, the concentration of antimony ions (Sb+) may be relatively high near an interface between the first electrode 20B and the memory layer 30B to cause a partial variation in concentration of the memory layer 30B. Conversely, in the memory cell 50A, the concentration of tellurium ions (Te−) may be relatively high near an interface between the first electrode 20A and the memory layer 30A to cause a partial variation in concentration of the memory layer 30A.

In conclusion, distributions of ions or vacancies in the memory layers 30A and 30B may depend on magnitudes of voltages applied to the memory layers 30A and 30B, directions of currents flowing through the memory layers 30A and 30B, and geometry of the memory layers 30A and 30B and the first electrodes 20A and 20B. Even if the same or substantially the same voltage is applied, resistances of the memory layers 30A and 30B may fluctuate due to the partial variations in the concentrations of the memory layers 30A and 30B. Accordingly, the memory cell 50A may have different operating characteristics from the memory cell 50B.

Meanwhile, the ion migration paths are schematically described in FIG. 5 by using, for example, antimony ions (Sb+) and tellurium ions (Te−), but inventive concepts are not limited thereto. In particular, similar to the above-described first memory layer (refer to 142 in FIG. 2), the memory layers 30A and 30B may include at least one selected from the group including tellurium (Te), selenium (Se), germanium (Ge), antimony (Sb), bismuth (Bi), lead (Pb), tin (Sn), indium (In), silver (Ag), arsenic (As), sulfur (S), phosphorus (P), and a mixture thereof. Also, the memory layers 30A and 30B may be doped with impurities, which may include nitrogen (N), oxygen (O), silicon (Si), carbon (C), boron (B), dysprosium (Dy) or a combination thereof. Accordingly, extents of ion migration in the memory layers 30A and 30B may further vary according to kinds and compositions of materials included in the memory layers 30A and 30B and kinds and concentrations of impurities contained in the memory layers 30A and 30B. Therefore, variations in operating characteristics of the memory cells 50A and 50B may further increase.

Referring back to FIGS. 2 to 4, according to example embodiments, the plurality of first memory cell pillars 140 may be located symmetrically to the plurality of second memory cell pillars 150 with respect to the plurality of common bit lines 120. For example, while a positive reset voltage Vreset is applied to the plurality of common bit lines 120 and a ground voltage is applied to the plurality of upper word lines 130 and the plurality of lower word lines 110, the same or substantially the same voltage (e.g., a reset voltage Vreset) may be applied to the first memory cell MC1 and the second memory cell MC2. Since the first memory cell MC1 is located symmetrically to the second memory cell MC2 with respect to the plurality of common bit lines 120, a portion of the first memory layer 142 adjacent to an interface between the first memory layer 142 and the first heater electrode HE1 may have the same or substantially the same distribution of ions and/or concentrations as a portion of the second memory layer 152 adjacent to an interface between the second memory layer 152 and the second heater electrode HE2. Accordingly, the first memory cell MC1 and the second memory cell MC2 may have more uniform operating characteristics.

As shown in FIG. 3, first sidewalls 140S_X of the plurality of first memory cell pillars 140 may be aligned with first sidewalls 110S_X of the plurality of lower word lines 110, and first sidewalls 150S_X of the plurality of second memory cell pillars 150 may be aligned with first sidewalls 130S_X of the plurality of upper word lines 130. Also, as shown in FIG. 4, second sidewalls 140S_Y of the plurality of first memory cell pillars 140 may be aligned with first sidewalls 120S_Y of the plurality of common bit lines 120, and second sidewalls 150S_Y of the plurality of second memory cell pillars 150 may be aligned with first sidewalls 120S_Y of the plurality of common bit lines 120.

This may be because the plurality of first memory cell pillars 140 and the plurality of second memory cell pillars 150 are formed by using three photolithography patterning processes during a process of manufacturing the memory device 100. For example, the first sidewalls 140S_X of the plurality of first memory cell pillars 140 and the first sidewalls 110S_X of the plurality of lower word lines 110 may be formed in alignment with one another during a first patterning process. Thereafter, the second sidewalls 140S_Y of the plurality of first memory cell pillars 140, the first sidewalls 120S_Y of the plurality of common bit lines 120, and the second sidewalls 150S_Y of the plurality of second memory cell pillars 150 may be formed in alignment with one another during a second patterning process. Thereafter, the first sidewalls 150S_X of the plurality of second memory cell pillars 150 and the first sidewalls 130S_X of the plurality of upper word lines 130 may be formed in alignment with one another during a third patterning process.

As described above, since a plurality of memory cell pillars 140 and 150 are formed by using only three photolithography patterning processes, degradation of and/or damage to the memory layers 142 and 152 and/or the selection devices 144 and 154 may be suppressed and/or prevented when the memory layers 142 and 152 and/or the selection device layers 144 and 154 are exposed to an etching atmosphere during a patterning process. Also, manufacturing costs of the memory device 100 may be reduced.

In addition, since the selection devices SW1 and SW2 include the selection device layers 144 and 154 including materials having OTS characteristics, a process of forming transistors or diodes may not be needed. For example, although a high-temperature annealing process is needed to activate impurities contained in a diode after forming the diode, the memory layers 142 and 152 containing phase-change materials may be damaged and/or contaminated in the high-temperature annealing environment. According to one or more example embodiments of inventive concepts, relatively complicated processes for forming transistors or diodes may not be needed, and undesirable damage to and/or contamination of the memory layers 142 and 152 due to complicated processes may be suppressed and/or prevented, thereby improving reliability of the memory device 100.

In general, when transistors or diodes are formed as selection devices, it may be necessary to form the transistors or the diodes in a substrate. Thus, it may be relatively difficult to embody a stack-type memory device including a plurality of layers stacked in a vertical direction. In particular, the memory layers 142 and 152 may be damaged and/or contaminated due to the high-temperature annealing process for activating the diodes. Thus, it may be relatively difficult to embody a stack-type cross-point array structure in which the diodes need to be located on the memory layers 142 and 152. However, according to one or more example embodiments of inventive concepts in which the selection device layers 144 and 154 are adopted instead of the diodes, the memory device 100 may have a stack-type cross-point array structure in which a plurality of layers are stacked in a vertical direction. Therefore, the integration density of the memory device 100 may increase.

As shown in FIG. 3, the first heater electrode HE1 may have a first width WH1_X in a second direction (Y direction in FIG. 2), and the second heater electrode HE2 may have a second width WH2_X in the second direction (Y direction in FIG. 2). The second width WH2_X may be equal or substantially equal to the first width WH1_X. Alternatively, as shown in FIG. 4, the first heater electrode HE1 may have a third width WH1_Y in a first direction (X direction in FIG. 2), and the second heater electrode HE2 may have a fourth width WH2_Y in the first direction. The fourth width WH2_Y may be equal or substantially equal to the third width WH1_Y. A horizontal sectional area (e.g., a sectional area parallel or substantially parallel to an X-Y plane) of the first heater electrode HE1 in contact with the first memory layer 142 may be equal or substantially equal to a horizontal sectional area of the second heater electrode HE2 in contact with the second memory layer 152. Accordingly, the plurality of first memory cell pillars 140 may have the same or substantially the same operating characteristics as the plurality of second memory cell pillars 150.

Meanwhile, as described above, a plurality of insulating patterns 160 may be respectively interposed between first memory cell pillars 140, which are arranged in a row in the second direction (Y direction) from among the plurality of first memory cell pillars 140. A plurality of insulating lines 165, which may extend in the second direction, may be respectively interposed between first memory cell pillars 140, which are arranged in a row in the first direction (X direction) from among the plurality of first memory cell pillars 140.

Also, a plurality of insulating lines 170, which may extend in the first direction, may be respectively interposed between second memory cell pillars 150, which are arranged in a row in the second direction (Y direction) from among the plurality of second memory cell pillars 150. However, inventive concepts are not limited thereto, and a plurality of air gaps (not shown) may be formed instead of the plurality of insulating patterns 160, the plurality of insulating lines 165, and the plurality of insulating lines 170. In this case, insulating lines (not shown) having a given (or, alternatively, desired or predetermined) thickness may be formed between the plurality of air gaps and the plurality of first memory cell pillars 140 and between the plurality of air gaps and the plurality of second memory cell pillars 150.

In the memory device 100 described with reference to FIGS. 2 to 4, the plurality of first memory cell pillars 140 may be located symmetrically to the plurality of second memory cell pillars 150 with respect to the plurality of common bit lines 120. Also, variations in cell characteristics due to non-uniform ion migration in the memory layers 142 and 152 included in the plurality of memory cell pillars 140 and 150 may be reduced. Accordingly, the memory device 100 may have more uniform operating characteristics.

Furthermore, since the first and second selection device layers 144 and 154 having OTS characteristics are located out of contact with the first and second heater electrodes HE1 and HE2 in the memory cell pillars 140 and 150, the first and second selection device layers 144 and 154 may not be undesirably degraded and/or damaged due to heat generated by the first and second heater electrodes HE1 and HE2 during a process of operating the memory device 100. Accordingly, the memory device 100 may have improved reliability.

In addition, since the memory device 100 is embodied by three patterning operations, undesirable degradation of and/or damage to the memory cell pillars 140 and 150 due to a patterning process may be suppressed and/or prevented, and manufacturing costs may be reduced.

In addition, since the memory device 100 includes the selection device layers 144 and 154 including materials having OTS characteristics instead of transistors or diodes, the memory device 100 may have a stack-type cross-point array structure, and integration density of the memory device 100 may be improved.

Figure 6:
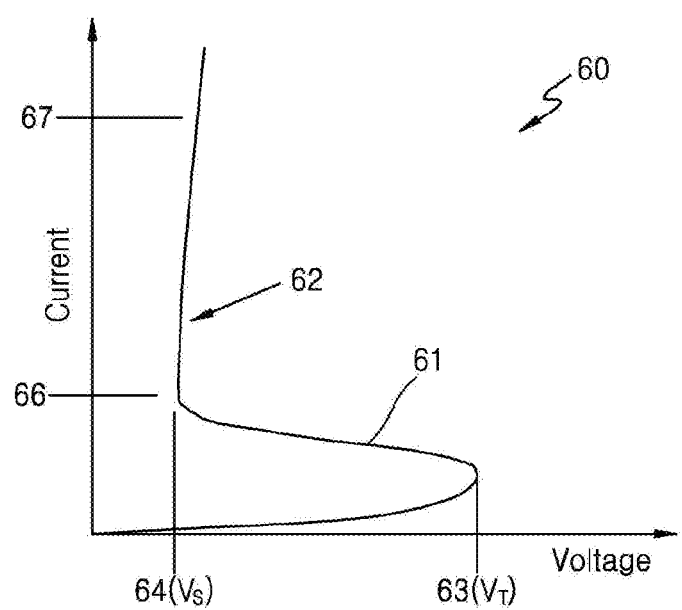
FIG. 6 is an example of a schematic voltage-current (V-I) graph of an ovonic threshold switching (OTS) device having OTS characteristics.

FIG. 6 is an example of a schematic voltage-current (V-I) graph 60 of an OTS device having OTS characteristics. FIG. 6 illustrates example current flowing through the OTS device having the OTS characteristics in response to a voltage applied between both ends of the OTS device.

Referring to FIG. 6, a first curve 61 shows current relative to a voltage while current is not supplied to the OTS device. Here, the OTS device may serve as a switching device having a threshold voltage $V_T$ having a first voltage level 63. When a voltage gradually increased from the origin at which a voltage is 0 and current is 0, current was hardly (e.g., relatively low or little current was) supplied to the OTS device until the voltage reached the threshold voltage $V_T$ (e.g., the first voltage level 63). However, as soon as the voltage exceeded the threshold voltage $V_T$, current supplied to the OTS device sharply increased, and the voltage applied to the OTS device was reduced to a second voltage level 64 (or a saturated voltage $V_S$).

A second curve 62 shows current relative to a voltage while current is supplied to the OTS device. As current flowing through the OTS device became higher than a first current level 66, a voltage applied to the OTS device slightly increased more than the second voltage level 64. For example, while current flowing through the OTS device was considerably increasing from the first current level 66 to a second current level 67, the voltage applied to the OTS device may slightly increase from the second voltage level 64. That is, for example, once current is supplied through the OTS device, the voltage applied to the OTS device may be maintained or almost maintained at a level of the saturated voltage $V_S$ (e.g., the second voltage level 64). If current is reduced to a holding current level (e.g., the first current level 66) or lower, the OTS device may be shifted again to a resistance state so that current may be suppressed and/or effectively blocked until a voltage increases to the threshold voltage $V_T$.

Figure 7:
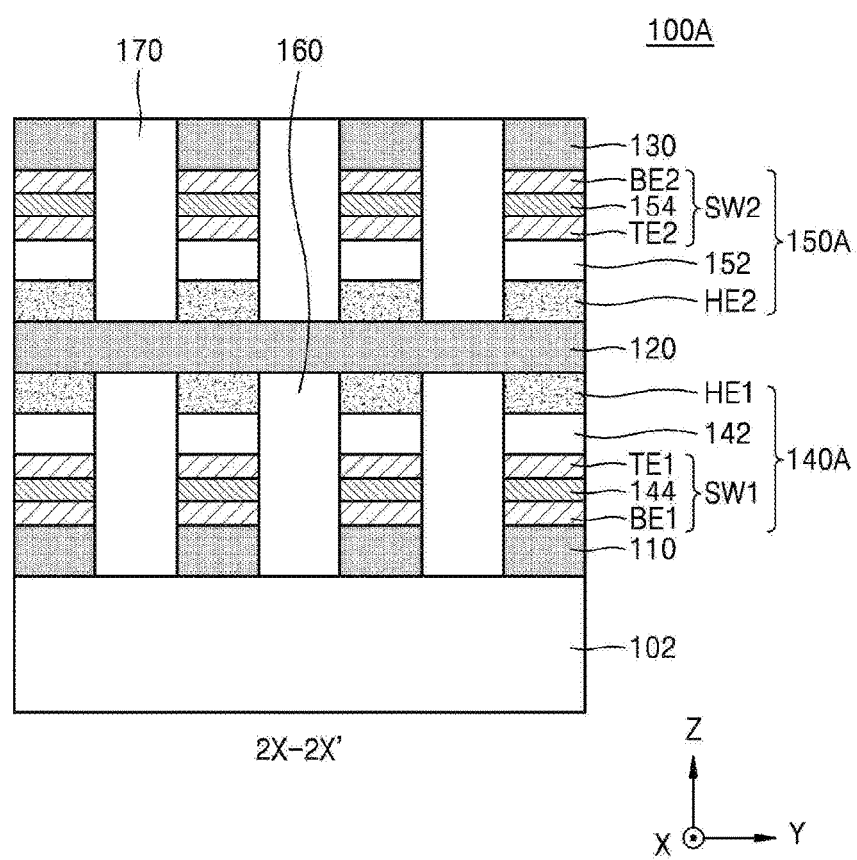
FIG. 7 is a cross-sectional view of a memory device according to an example embodiment.

FIG. 7 is a cross-sectional view of a memory device 100A according to an example embodiment. In FIG. 7, the same reference numerals are used to denote the same elements as in FIGS. 1 to 6. FIG. 7 is a cross-sectional view taken along a line 2X-2X' of FIG. 2. The memory device 100A of FIG. 7 may be similar to the memory device 100 described with reference to FIGS. 2 to 4 except for the arrangement of elements in a plurality of first memory cell pillars 140A and a plurality of second memory cell pillars 150A.

Referring to FIG. 7, each of a plurality of first memory cell pillars 140A may include a first selection device SW1, a first memory layer 142, and a first heater electrode HE1, which may be sequentially located on a plurality of lower word lines 110. Each of a plurality of second memory cell pillars 150A may include a second heater electrode HE2, a second memory layer 152, and a second selection device SW2, which may be sequentially located on a plurality of common bit lines 120. The plurality of first memory cell pillars 140A may be located symmetrically to the plurality of second memory cell pillars 150A with respect to the plurality of common bit lines 120.

Figure 8:
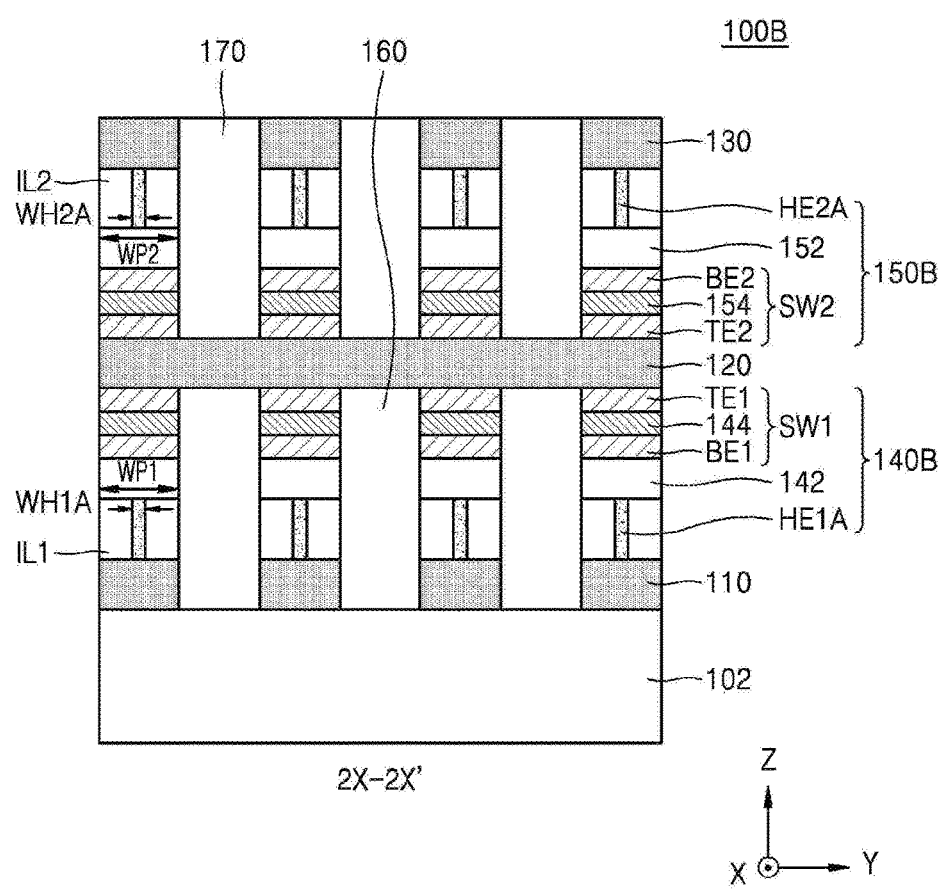
FIG. 8 is a cross-sectional view of a memory device according to an example embodiment.

FIG. 8 is a cross-sectional view of a memory device 100B according to an example embodiment. In FIG. 8, the same reference numerals are used to denote the same elements as in FIGS. 1 to 7. FIG. 8 is a cross-sectional view taken a line 2X-2X' of FIG. 2. The memory device 100B of FIG. 8 may be similar to the memory device 100 described with reference to FIGS. 2 to 4 except for shapes of first and second heater electrodes HE1A and HE2A.

Referring to FIG. 8, first heater electrodes HE1A of a plurality of first memory cell pillars 140B and second heater electrodes HE2A of a plurality of second memory cell pillars 150B may be dash-type electrodes. A first insulating pattern IL1 may be formed on a sidewall of the first heater electrode HE1A, and a second insulating pattern IL2 may be formed on a sidewall of the second heater electrode HE2A.

In example embodiments, each of the first heater electrodes HE1A may have a first width WH1A in a second direction (Y direction), and the first width WH1A may be less than a third width WP1 of the first memory layer 142 in a second direction. The first width WH1A of the first heater electrode HE1A may be about 10% to about 50% of the third width WP1 of the first memory layer 142, but inventive concepts are not limited thereto. Also, the second heater electrode HE2A may have a second width WH2A in the second direction, and the second width WH2A may be less than a fourth width WP2 of the second memory layer 152 in the second direction. The second width WH2A of the second heater electrode HE2A may be about 10% to about 50% of the fourth width WP2 of the second memory layer 152, but inventive concepts are not limited thereto.

Since the first width WH1A of the first heater electrode HE1A is less than the third width WP1 of the first memory layer 142, a phase change may partially occur in a central portion of the first memory layer 142 due to heat generated by the first heater electrode HE1A. Accordingly, occurrence of thermal interference in an adjacent first memory layer 142 of an adjacent first memory cell pillar 140B due to heat generated by the first heater electrode HE1A may be suppressed and/or prevented. Alternatively, degradation of and/or damage to the first selection device SW1 located opposite the first heater electrode HE1A across the first memory layer 142 due to heat generated by the first heater electrode HE1A may be suppressed and/or prevented.

Although not shown in FIG. 8, a width of the first heater electrode HE1A in a first direction (X direction) may be equal or substantially equal to a width of the first memory layer 142 in the first direction, and a width of the second heater electrode HE2A in the first direction may be equal or substantially equal to a width of the second memory layer 152 in the first direction. However, inventive concepts are not limited thereto.

In example embodiments, the first width WH1A of the first heater electrode HE1A may be equal or substantially equal to the second width WH2A of the second heater electrode HE2A. Thus, a variation in resistance of the first memory layer 142 due to heat generated by the first heater electrode HE1A may be equal or substantially equal to a variation in resistance of the second memory layer 152 due to heat generated by the second heater electrode HE2A. Accordingly, the memory device 100B may have more uniform operating characteristics.

Figure 9:
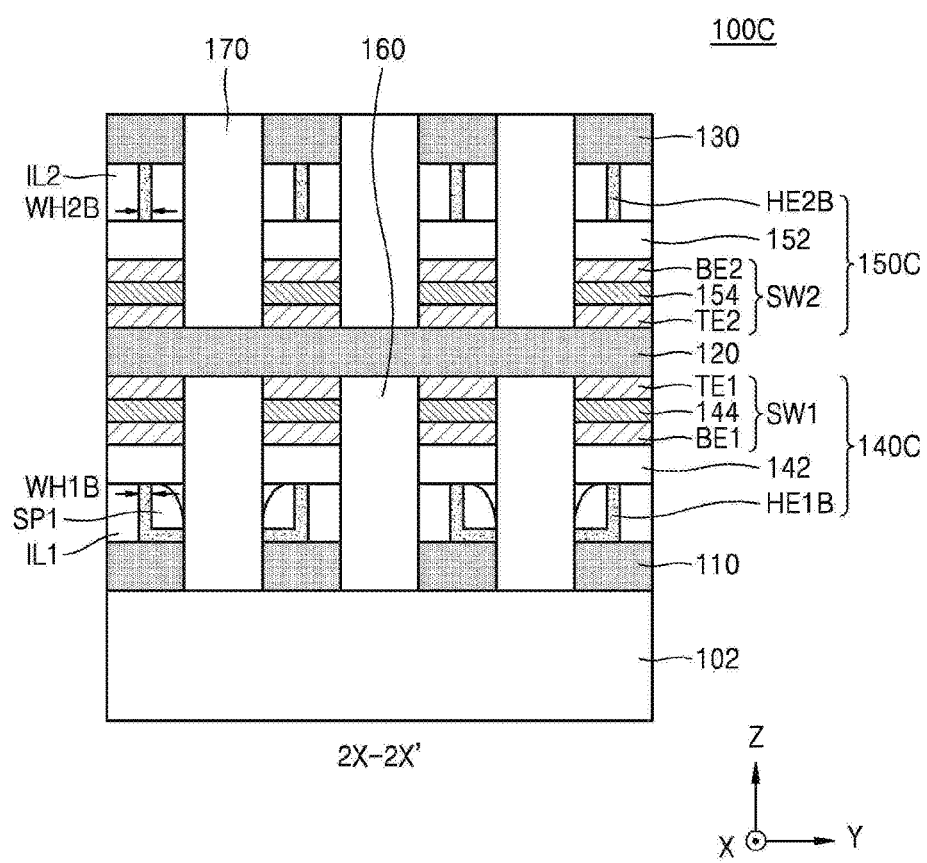
FIG. 9 is a cross-sectional view of a memory device according to an example embodiment.

FIG. 9 is a cross-sectional view of a memory device 100C according to an example embodiment. In FIG. 9, the same reference numerals are used to denote the same elements as in FIGS. 1 to 8. FIG. 9 is a cross-sectional view taken along a line 2X-2X' of FIG. 2. The memory device 100C of FIG. 9 may be similar to the memory device 100 described with reference to FIGS. 2 to 4 except for shapes of the first and second heater electrodes HE1B and HE2B.

Referring to FIG. 9, the first heater electrode HE1B may have an L sectional shape, and the second heater electrode HE2B may have an I sectional shape.

The first heater electrode HE1B may have an upper width WH1B less than a lower width thereof. A first insulating pattern IL1 may be formed on one side surface of the first heater electrode HE1B, and a first spacer SP1 may be formed on the opposite side surface of the first heater electrode HE1B. A sidewall of the first insulating pattern IL1 may be in contact with the first heater electrode HE1B, while both a sidewall and a bottom surface of the first spacer SP1 may be in contact with the first heater electrode HE1B.

The upper width WH1B of the first heater electrode HE1B may be equal or substantially equal to the width WH2B of the second heater electrode HE2B. Although the first heater electrode HE1B has a different shape from the second heater electrode HE2B, an area of the first heater electrode HE1B in contact with the first memory layer 142 may be equal or substantially equal to an area of the second heater electrode HE2B in contact with the second memory layer 152. Accordingly, a variation in resistance of the first memory layer 142 due to heat generated by the first heater electrode HE1B may be equal or substantially equal to a variation in resistance of the second memory layer 152 due to heat generated by the second heater electrode HE2B. Accordingly, the memory device 100C may have more uniform operating characteristics.

Figure 10:
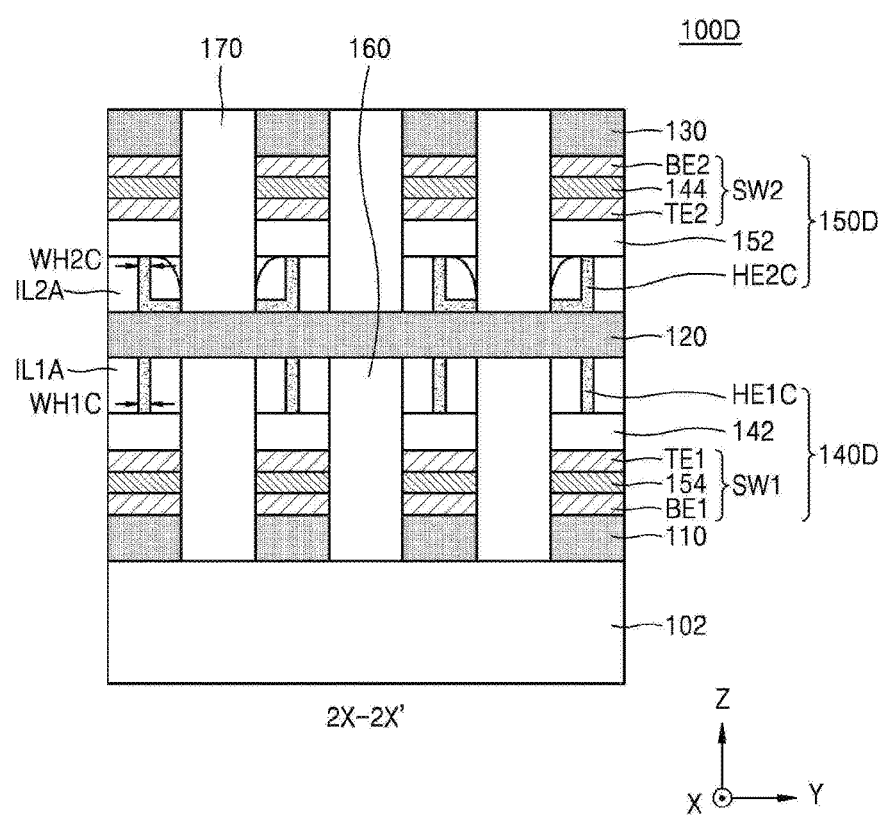
FIG. 10 is a cross-sectional view of a memory device according to an example embodiment.

FIG. 10 is a cross-sectional view of a memory device 100D according to an example embodiment. In FIG. 10, the same reference numerals are used to denote the same elements as in FIGS. 1 to 9. FIG. 10 is a cross-sectional view taken along a line 2X-2X' of FIG. 2. The memory device 100D of FIG. 10 may be similar to the memory device 100 described with reference to FIGS. 2 to 4 except for shapes of first and second heater electrodes HE1C and HE2C.

Referring to FIG. 10, the first heater electrode HE1C may have an I-shaped section, while the second heater electrode HE2C may have an L-shaped section.

The second heater electrode HE2C may have an upper width WH2C less than a lower width thereof, and the upper width WH2C of the second heater electrode HE2C may be equal or substantially equal to a width WH1C of the first heater electrode HE1C.

The first heater electrode HE1C may be located on the first memory layer 142, while the second heater electrode HE2C may be located under the second memory layer 152. Thus, a sectional area of the first heater electrode HE1C in contact with the first memory layer 142 may be equal or substantially equal to a sectional area of the second heater electrode HE2C in contact with the second memory layer 152. Accordingly, although a plurality of first memory cell pillars 140D are not formed symmetrically to a plurality of second memory cell pillars 150D with regard to shapes thereof, a variation in resistance of the first memory layer 142 due to heat generated by the first heater electrode HE1C may be equal or substantially equal to a variation in resistance of the second memory layer 152 due to heat generated by the second heater electrode HE2C. Therefore, the memory device 100D may have more uniform operating characteristics.

Figure 11:
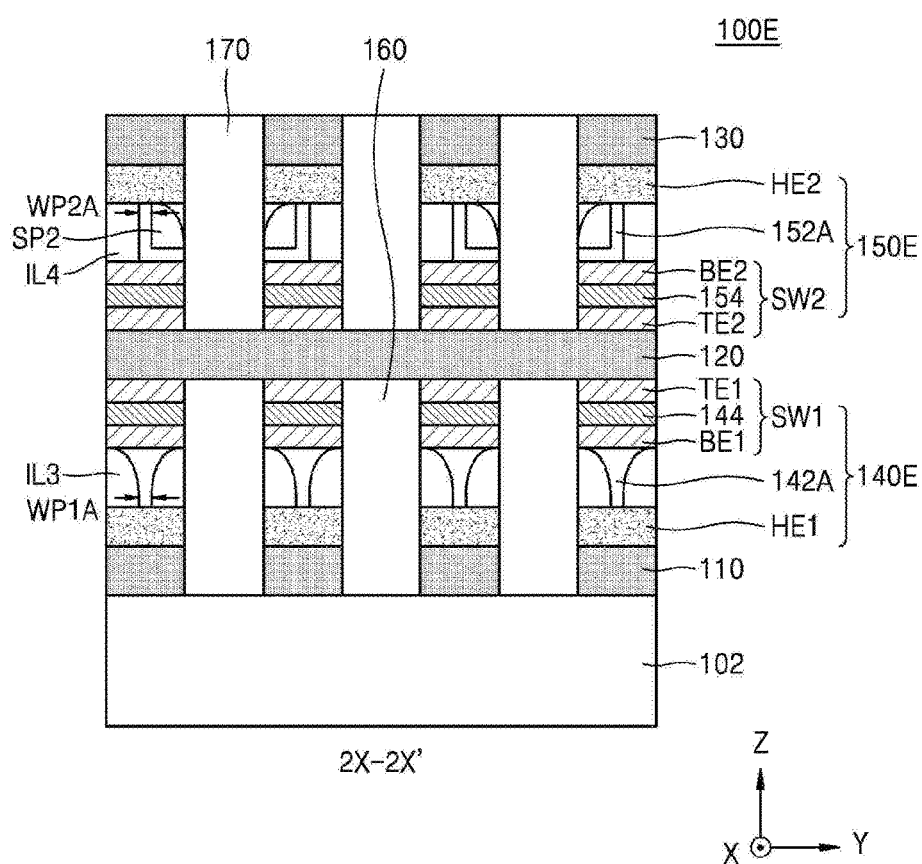
FIG. 11 is a cross-sectional view of a memory device according to an example embodiment.

FIG. 11 is a cross-sectional view of a memory device 100E according to an example embodiment. In FIG. 11, the same reference numerals are used to denote the same elements as in FIGS. 1 to 10. FIG. 11 is a cross-sectional view taken along a line 2X-2X' of FIG. 2. The memory device 100E of FIG. 11 may be similar to the memory device 100 described with reference to FIGS. 2 to 4 except for shapes of first and second memory layers 142A and 152A.

Referring to FIG. 11, a first memory layer 142A of each of a plurality of first memory cell pillars 140E may be a damascene-type electrode, and a second memory layer 152A of each of a plurality of second memory cell pillars 150E may have an L-shaped section. The first memory layer 142A may have a shape defined by first insulating patterns IL3 located on both sides of the first memory layer 142A. Since the first insulating pattern IL3 has an inclined and convex sidewall having a lower width larger than an upper width thereof, the first memory layer 142A located between the two first insulating patterns IL3 may also have an inclined and concave sidewall. The first memory layer 142A may have a lower width WP1A less than an upper width thereof. In example embodiments, the lower width WP1A of the first memory layer 142A may be about 10% to about 50% a width (refer to HE1_X in FIG. 3) of a first heater electrode HE1, but inventive concepts are not limited thereto.

Since the first heater electrode HE1 is located under the first memory layer 142A, a contact area between the first memory layer 142A and the first heater electrode HE1 may be less than a sectional area of the first heater electrode HE1. Since the lower width WP1A of the first memory layer 142A is less than the width HE1_X of the first heater electrode HE1, a variation in resistance of the first memory layer 142A due to a change in the phase of the first memory layer 142A may accelerate due to heat generated by the first heater electrode HE1.

In example embodiments, the lower width WP1A of the first memory layer 142A may be equal or substantially equal to an upper width WP2A of the second memory layer 152A. Accordingly, although the plurality of first memory cell pillars 140E are not formed symmetrically to the plurality of second memory cell pillars 150E, a variation in resistance of the first memory layer 142A due to heat generated by the first heater electrode HE1 may be equal or substantially equal to a variation in resistance of the second memory layer 152A due to heat generated by the second heater electrode HE2. Accordingly, the memory device 100E may have more uniform operating characteristics.

Figure 12:
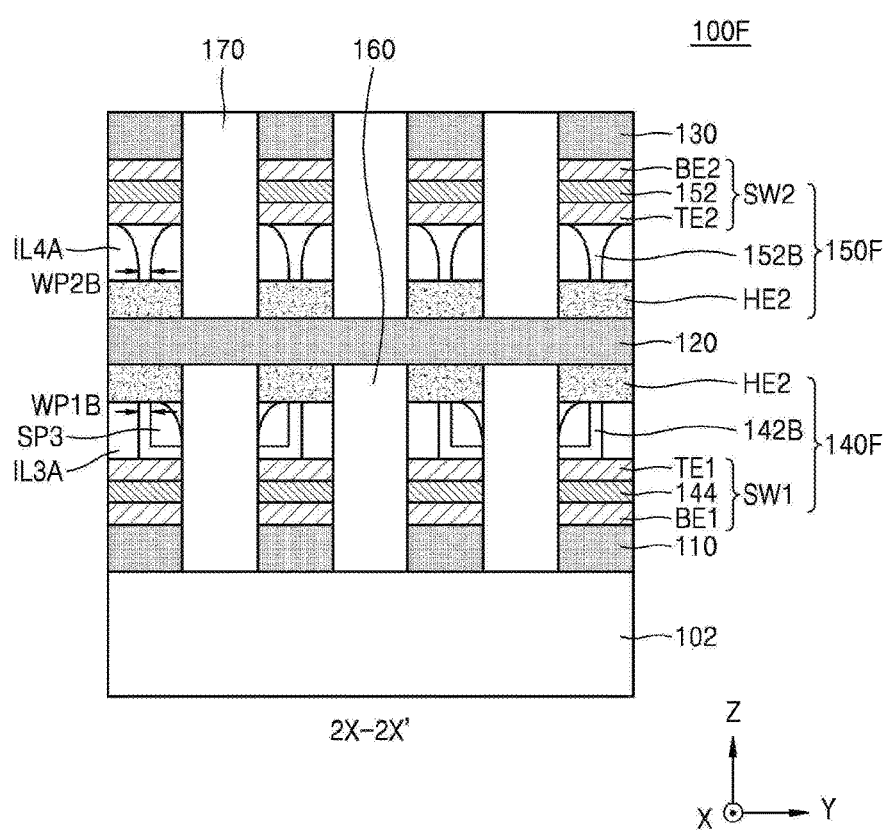
FIG. 12 is a cross-sectional view of a memory device according to an example embodiment.

FIG. 12 is a cross-sectional view of a memory device 100F according to an example embodiment. In FIG. 12, the same reference numerals are used to denote the same elements as in FIGS. 1 to 11. FIG. 12 is a cross-sectional view taken along a line 2X-2X' of FIG. 2. The memory device 100F of FIG. 12 may be similar to the memory device 100 described with reference to FIGS. 2 to 4 except for shapes of first and second memory layers 142B and 152B.

Referring to FIG. 12, a first memory layer 142B of each of a plurality of first memory cell pillars 140F may have an L-shaped section, and a second memory layer 152B of each of a plurality of second memory cell pillars 150F may be a damascene-type electrode. Since a first heater electrode HE1 is located on the first memory layer 142B and a second heater electrode HE is located under the second memory layer 152B, an area of a portion of the first heater electrode HE1 in contact with the first memory layer 142B may be less than an area of the first heater electrode HE1, and an area of a portion of the second heater electrode HE2 in contact with the second memory layer 152B may be less than an area of the second heater electrode HE2.

Figure 13:
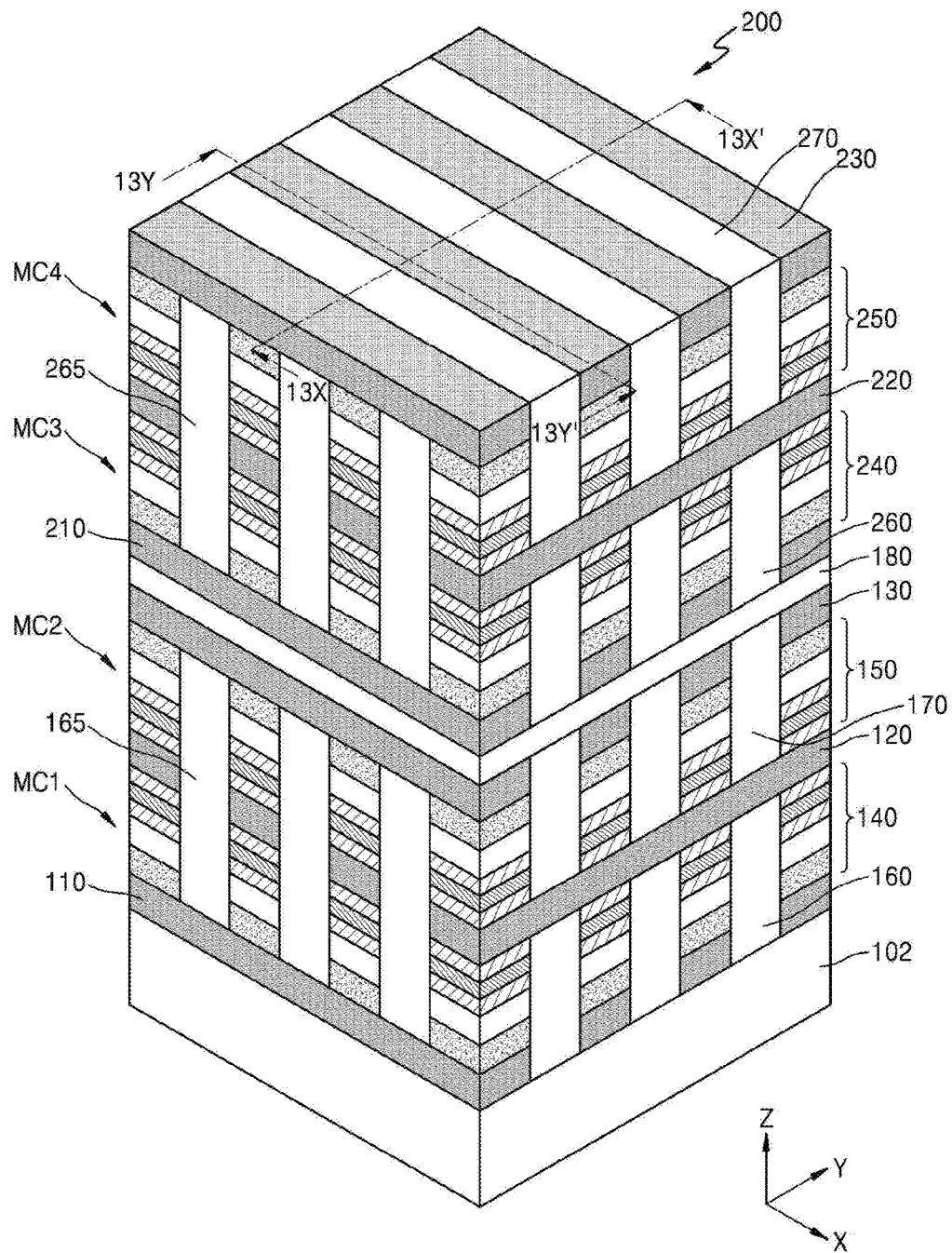
FIG. 13 is a cross-sectional view of a memory device according to an example embodiment.
Figure 14:
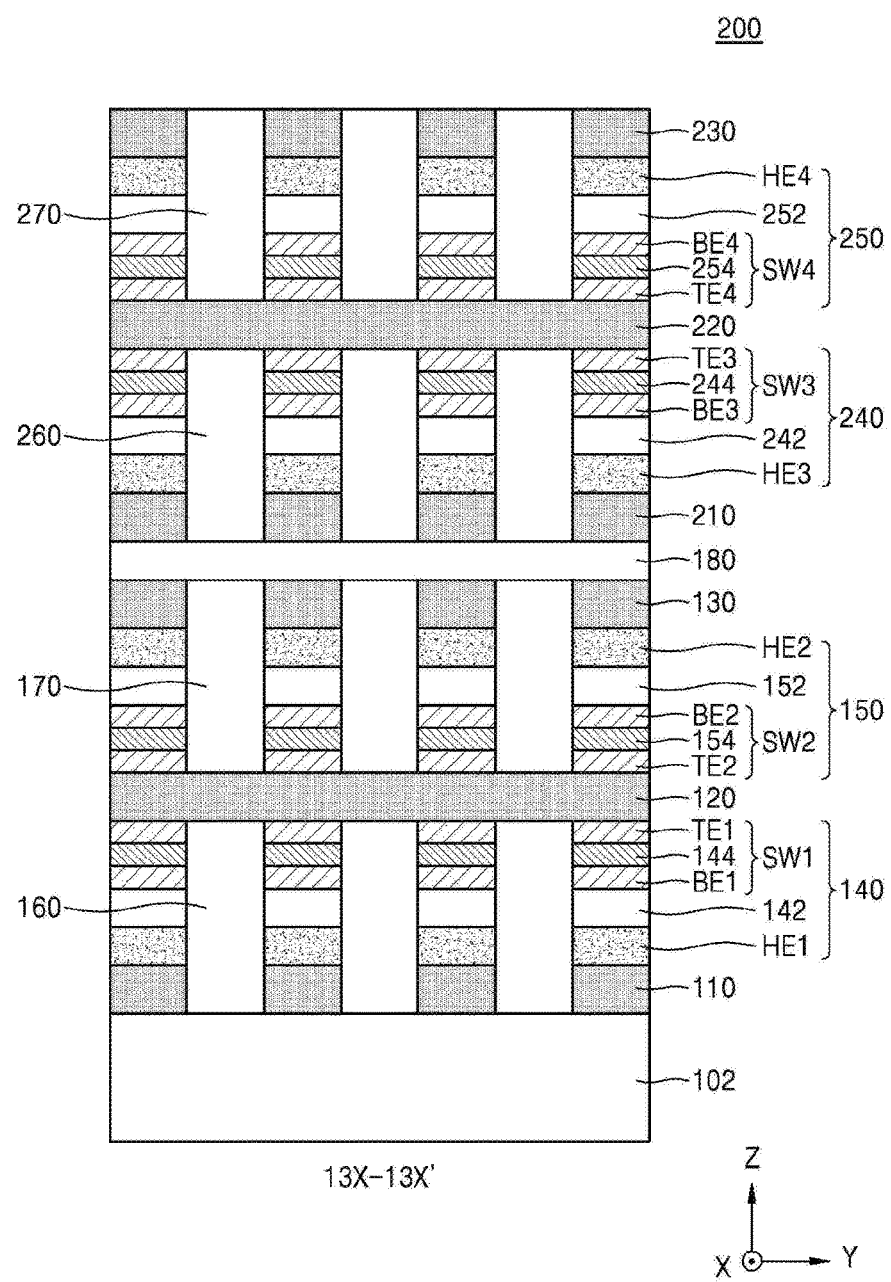
FIG. 14 is a cross-sectional view taken along a line 13X-13X' of FIG. 13.
Figure 15:
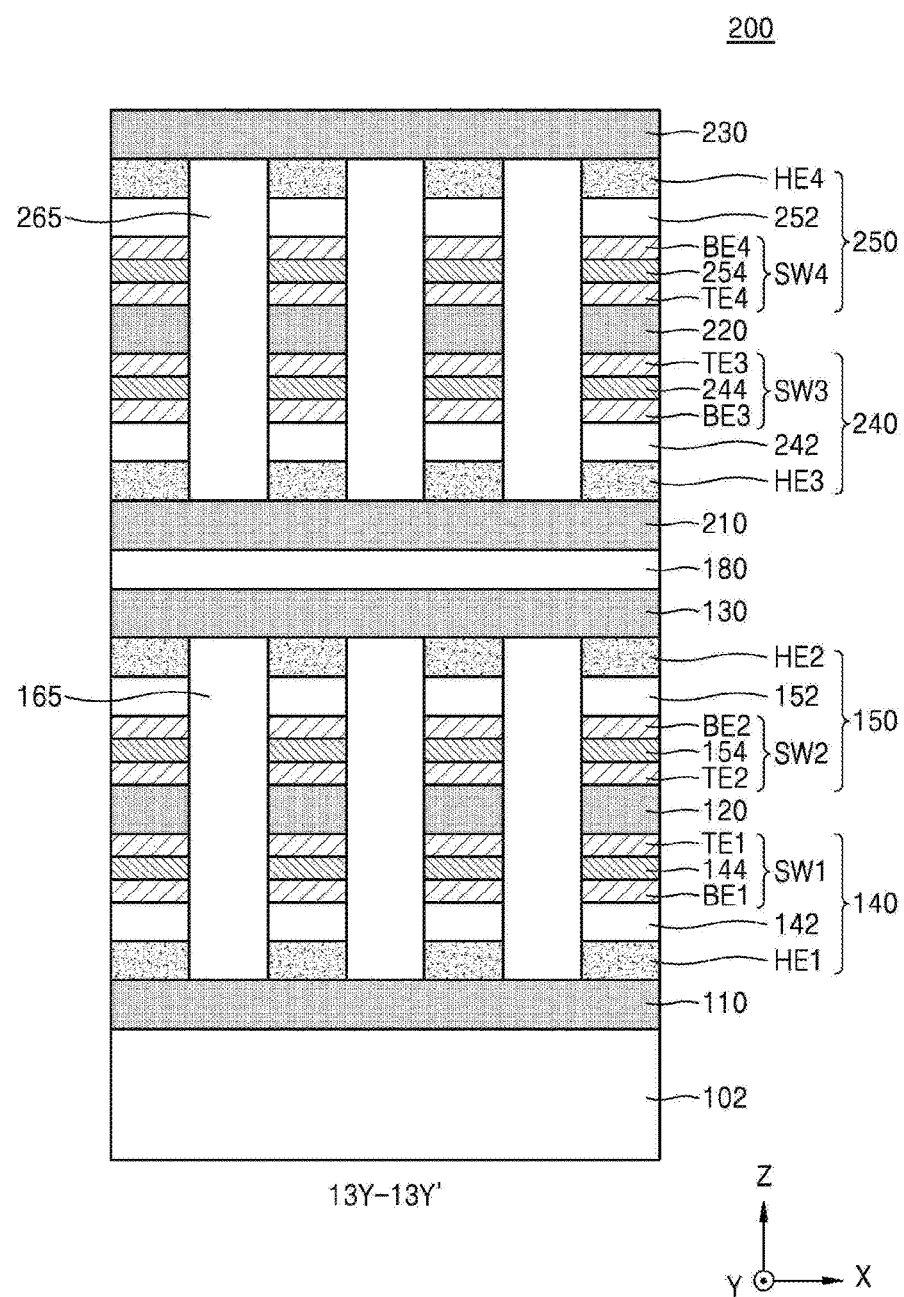
FIG. 15 is a cross-sectional view taken along a line 13Y-13Y' of FIG. 13.

FIG. 13 is a perspective view of a memory device 200 according to an example embodiment. FIG. 14 is a cross-sectional view taken along a line 13X-13X' of FIG. 13, and FIG. 15 is a cross-sectional view taken along a line 13Y-

13Y' of FIG. 13. In FIGS. 13 to 15, the same reference numerals are used to denote the same elements as in FIG. 12.

Referring to FIG. 13, a plurality of second memory cells MC2 may be located on a plurality of first memory cells MC1 and symmetrical to the plurality of first memory cells MC1 with respect to a plurality of first common bit lines 120 interposed between the plurality of second memory cells MC2 and the plurality of first memory cells MC1. A plurality of fourth memory cells MC4 may be located on a plurality of third memory cells MC3 and symmetrical to the plurality of third memory cells MC3 with respect to a plurality of second common bit lines 220 interposed between the plurality of fourth memory cells MC4 and the plurality of third memory cells MC3. A plurality of first lower word lines 110 may be located under the plurality of first memory cells MC1, and a plurality of first upper word lines 130 may be located on the plurality of second memory cells MC2. A plurality of second lower word lines 210 may be located under the plurality of third memory cells MC3, and a plurality of second upper word lines 230 may be located on the plurality of fourth memory cells MC4. Also, an insulating layer 180 may be interposed between the plurality of first upper word lines 130 and the plurality of second lower word lines 210.

The plurality of first memory cells MC1, the plurality of second memory cells MC2, the plurality of third memory cells MC3, and the plurality of fourth memory cells MC4 may include a plurality of first memory cell pillars 140, a plurality of second memory cell pillars 150, a plurality of third memory cell pillars 240, and a plurality of fourth memory cell pillars 250, respectively. In FIGS. 13 to 15, although the first to fourth memory cell pillars 140, 150, 240, and 250 are denoted by similar reference numerals to the memory cell pillars 140 and 150 described with reference to FIGS. 2 to 4, but inventive concepts are not limited thereto. Unlike shown in FIGS. 13 to 15, each of the first to fourth memory cell pillars 140, 150, 240, and 250 may include at least one of the memory cell pillars 140A, 140B, 140C, 140D, 140E, 140F, 150A, 150B, 150C, 150D, 150E, and 150F described with reference to FIGS. 7 to 12.

Unlike shown in FIGS. 13 to 15, a plurality of common word lines (not shown) may be formed by combining the plurality of first upper word lines 130 with the plurality of second lower word lines 210. In this case, an insulating layer 180 may be omitted between the plurality of first upper word lines 130 and the plurality of second lower word lines 210.

The plurality of first memory cell pillars may have structures symmetrical to structures of the plurality of second memory cell pillars 150 with respect to the plurality of first common bit lines 120. Also, the plurality of third memory cell pillars 240 may have structures symmetrical to structures of the plurality of fourth memory cell pillars 250 with respect to the plurality of second common bit lines 220. Thus, the memory device 200 may have more uniform operating characteristics.

Furthermore, since selection devices SW1, SW2, SW3, and SW4 include materials having OTS characteristics, the memory device 200 having a stack-type cross-point array structure including a plurality of layers stacked in a vertical direction may be embodied, and integration density of the memory device 200 may be improved.

FIGS. 16A to 16M are cross-sectional views of process operations of a method of manufacturing a memory device 100 according to an example embodiment.

The method of manufacturing the memory device 100 shown in FIGS. 2 to 4 will be described with reference to FIGS. 16A to 16M. Each of FIGS. 16A to 16M shows a cross-sectional view taken along a line 2X-2X' of FIG. 2 and a cross-sectional view taken along a line 2Y-2Y' of FIG. 2, which illustrate the corresponding process operation. In FIGS. 16A to 16M, the same reference numerals are used to denote the same elements as in FIGS. 1 to 15, and detailed descriptions thereof are omitted.

Figure 16A:
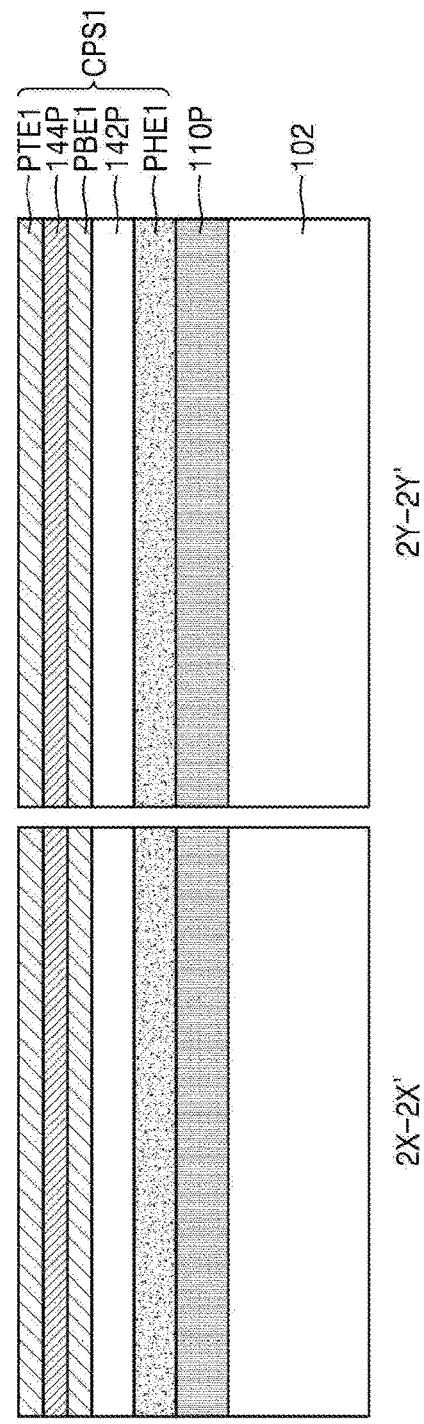

Referring to FIG. 16A, a first conductive layer 110P may be formed on a substrate 102. A first preliminary heater electrode layer PHE1, a first preliminary memory layer 142P, a first preliminary lower electrode layer PBE1, a first preliminary selection device layer 144P, and a first preliminary upper electrode layer PTE1 may be sequentially stacked on the first conductive layer 110P, thereby forming a first stack structure CSP1 for forming a cross-point array.

In example embodiments, the first conductive layer 110P may include a metal, a conductive metal nitride, a conductive metal oxide, or a combination thereof. In some example embodiments, the first conductive layer 110P may include W, WN, Au, Ag, Cu, Al, TiAlN, Jr, Pt, Pd, Ru, Zr, Rh, Ni, Co, Cr, Sn, Zn, ITO, an alloy thereof, or a combination thereof. In some other example embodiments, the first conductive layer 110P may include a metal layer and a conductive barrier layer covering at least a portion of the metal layer. The conductive barrier layer may include, for example, titanium (Ti), titanium nitride (TiN), tantalum (Ta), tantalum nitride (TaN), or a combination thereof, but is not limited to the examples.

The first preliminary heater electrode layer PHE1 may include a high-melting-point metal or a nitride thereof, such as TiN, TiSiN, TiAlN, TaSiN, TaAlN, TaN, WSi, WN, TiW, MoN, NbN, TiBN, ZrSiN, WSiN, WBN, ZrAlN, MoAlN, TiAl, TiON, TiAlON, WON, TaON, or a combination thereof.

The first preliminary memory layer 142P may be formed by using at least one selected from the group consisting of tellurium (Te), selenium (Se), germanium (Ge), antimony (Sb), bismuth (Bi), lead (Pb), tin (Sn), indium (In), silver (Ag), arsenic (As), sulfur (S), phosphorus (P), and a mixture thereof. The first preliminary memory layer 142P may be doped with impurities containing, for example, nitrogen (N), oxygen (O), silicon (Si), carbon (C), boron (B), dysprosium (Dy), or a combination thereof.

Each of the first preliminary lower electrode layer PBE1 and the first preliminary upper electrode layer PTE1 may include a metal, a conductive metal nitride, a conductive metal oxide, or a combination thereof. In an example, each of the first preliminary lower electrode layer PBE1 and the first preliminary upper electrode layer PTE1 may include a TiN layer, but inventive concepts are not limited thereto. For example, each of the first preliminary lower electrode layer PBE1 and the first preliminary upper electrode layer PTE1 may include a conductive layer including a metal or a conductive metal nitride and at least one conductive barrier layer covering at least a portion of the conductive layer. The conductive barrier layer may include a metal oxide, a metal nitride, or a combination thereof, but inventive concepts are not limited thereto.

The first preliminary selection device layer 144P may be formed by using at least one selected from the group including tellurium (Te), selenium (Se), germanium (Ge), arsenic (As), silicon (Si), and a mixture thereof. For example, the first preliminary selection device layer 144P may be formed by using AsSe, AsSeGe, AsSeGeTe, and/or AsGeTeSi.

Figure 16B:
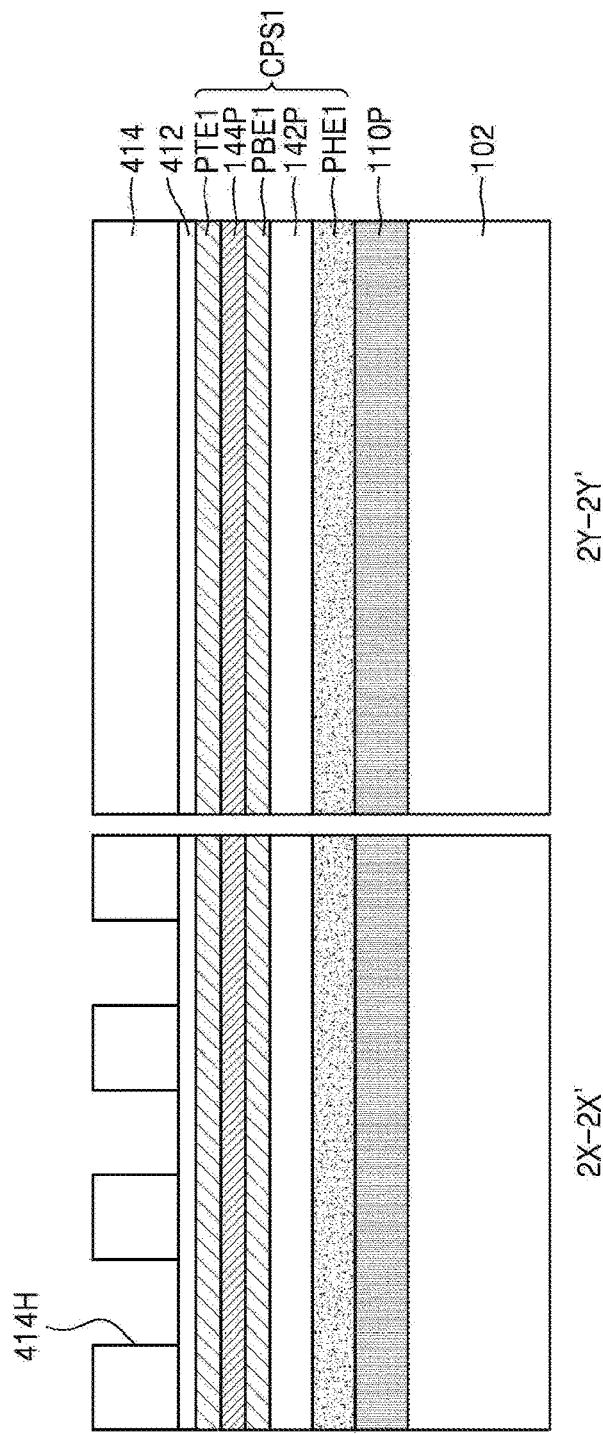

Referring to FIG. 16B, a sacrificial layer 412 may be formed on the first stack structure CPS1. In example embodiments, the sacrificial layer 412 may be formed by using a silicon nitride layer, but inventive concepts are not limited thereto.

Thereafter, a first mask pattern 414 may be formed on the sacrificial layer 412.

The first mask pattern 414 may include a plurality of openings 414H, which may extend parallel or substantially parallel to one another in a first direction (refer to the X direction in FIG. 2), and a plurality of line patterns, which may extend parallel or substantially parallel to one another in the first direction. The first mask pattern 414 may include a single layer or a multi-layered structure including a plurality of stacked layers. For example, the first mask pattern 414 may include a photoresist pattern, silicon oxide pattern, a silicon nitride pattern, a silicon oxynitride pattern, a polysilicon pattern, or a combination thereof, but materials included in the first mask pattern 414 are not limited thereto, and the first mask pattern 414 may include various other materials.

Figure 16C:
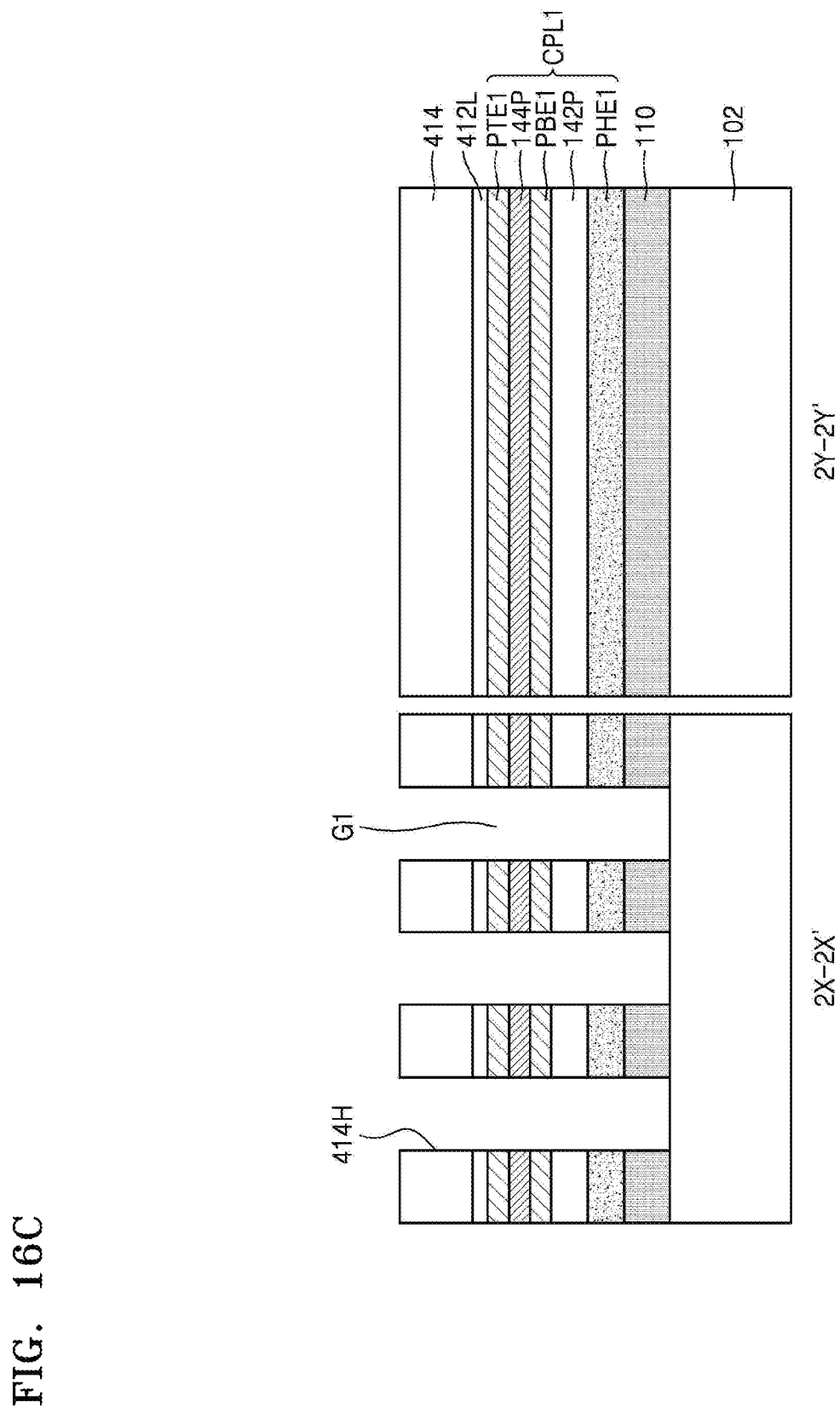

Referring to FIG. 16C, the sacrificial layer 412, the first stack structure CPS1, and the first conductive layer 110P may be sequentially anisotropically etched by using the first mask pattern 414 as an etch mask so that the first stack structure CPS1 may be separated into a plurality of first stack lines CPL1 and the first conductive layer 110P may be separated into a plurality of lower word lines 110.

As a result, a plurality of lower word lines 110, a plurality of first stack lines CPL1, and a plurality of sacrificial lines 412L may be formed and extend parallel or substantially parallel to one another in the first direction (refer to the X direction in FIG. 2), and a plurality of gaps G1 may be formed between the plurality of lower word lines 110, between the plurality of sacrificial lines 412L, and between the plurality of first stack lines CPL1 and extend parallel or substantially parallel to one another in the first direction (or X direction).

Due to the formation of the plurality of first gaps G1, portions of a top surface of the substrate 102 may be exposed again within the plurality of first gaps G1.

Figure 16D:
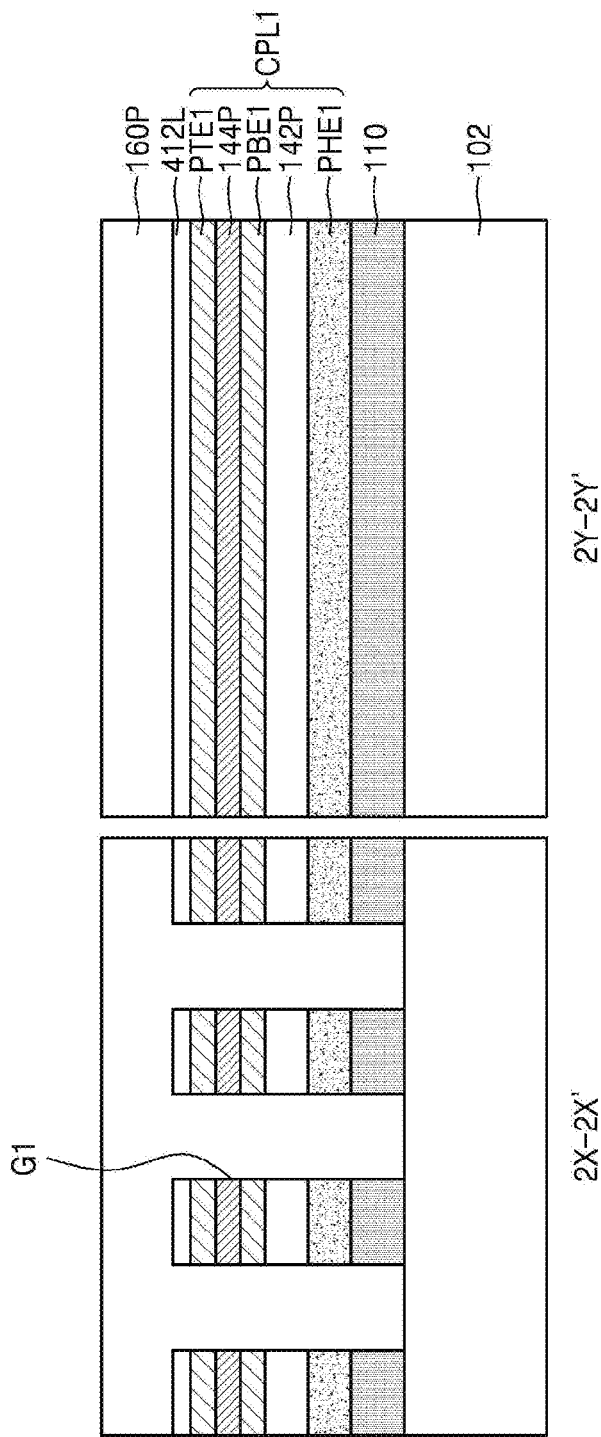

Referring to FIG. 16D, top surfaces of the plurality of sacrificial lines 412L may be exposed by removing the first mask pattern (refer to 414 in FIG. 16C), and each of the plurality of first gaps G1 may be filled with a first insulating layer 160P.

The first insulating layer 160P may include a different material from a material included in the plurality of sacrificial lines 412L. For example, when the plurality of sacrificial lines 412L include a silicon nitride layer, the first insulating layer 160P may be a silicon oxide layer. The first insulating layer 160P may include a single insulating layer or a plurality of insulating layers, but inventive concepts are not limited thereto.

Figure 16E:
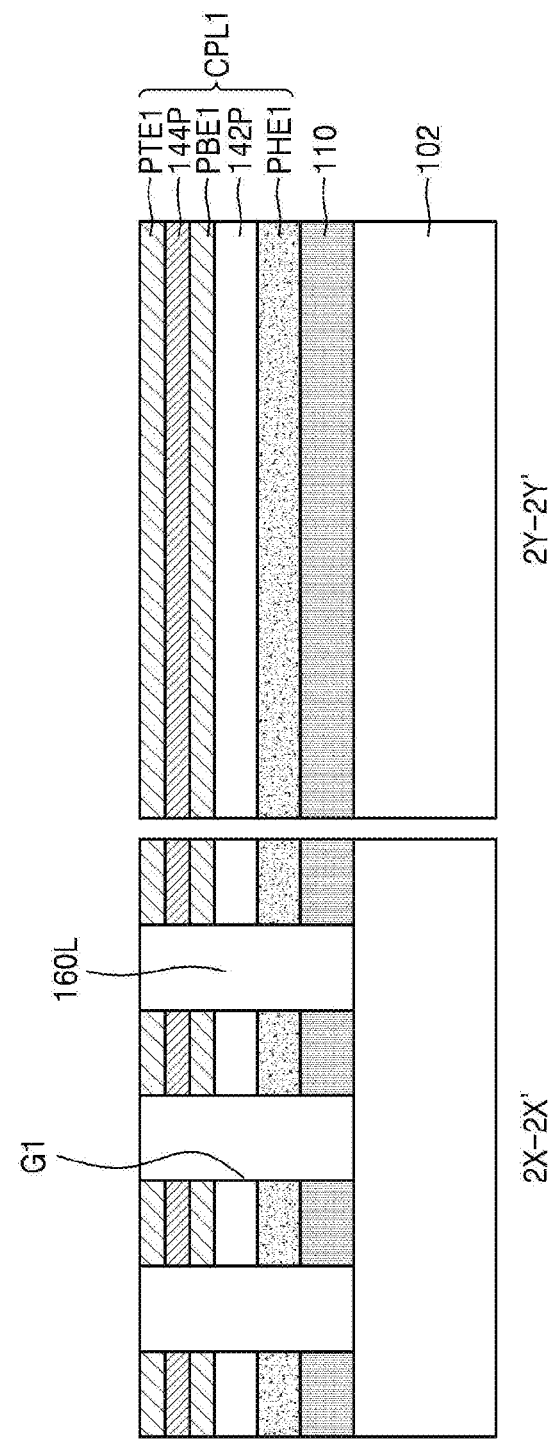

Referring to FIG. 16E, portions of the first insulating layer 160P on the plurality of sacrificial lines 412L may be removed by using an etch selectivity between the first insulating layer 160P and the plurality of sacrificial lines 412L so that a plurality of first insulating lines 160L may remain in the plurality of first gaps G1.

In some example embodiments, the first insulating lines 160L may be polished by using a chemical mechanical polishing (CMP) process by using the plurality of sacrificial lines 412L as a polishing stop layer so that the plurality of first insulating lines 160L may remain within the plurality of first gaps G1.

Thereafter, the plurality of sacrificial lines 412L may be removed, and a first preliminary upper electrode layer PTE1 may be exposed again on top surfaces of the plurality of first stack lines CPL1.

Herein, the plurality of sacrificial lines 412L may function as a protection layer for suppressing and/or preventing a surface of the first preliminary upper electrode layer PTE1 from being exposed during the process of patterning the first stack structure CPS1, the process of forming the first insulating layer 160P, and the process of polishing the first insulating lines 160L. The processes of forming and removing the plurality of sacrificial lines 412L may be selectively performed.

Figure 16F:
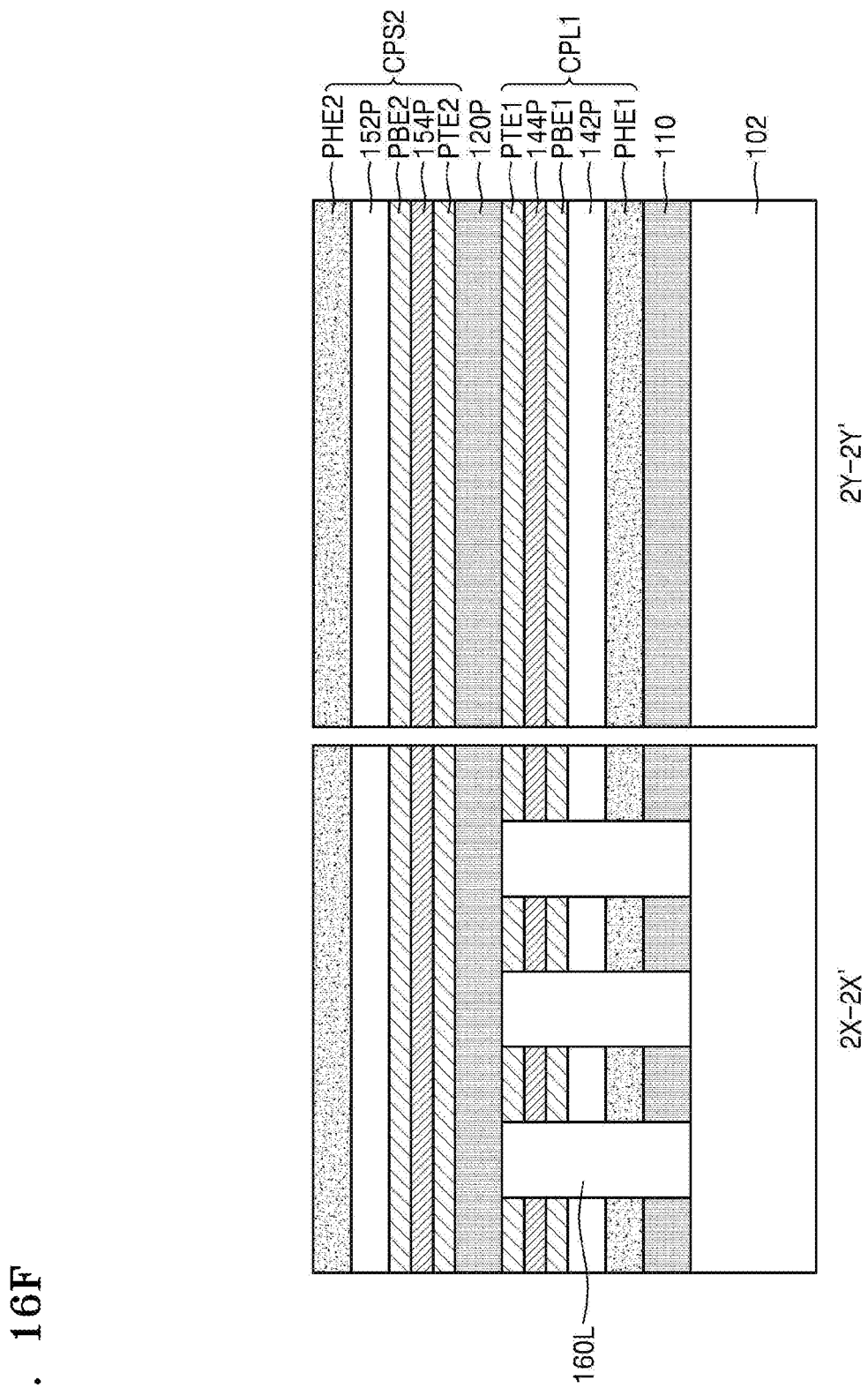

Referring to FIG. 16F, a second conductive layer 120P may be formed on the exposed top surface of the first preliminary upper electrode layer PTE1 and exposed top surfaces of the plurality of first insulating lines 160L.

The second conductive layer 120P may include a metal, a conductive metal nitride, a conductive metal oxide, or a combination thereof. In some example embodiments, the second conductive layer 120P may include W, WN, Au, Ag, Cu, Al, TiAlN, Jr, Pt, Pd, Ru, Zr, Rh, Ni, Co, Cr, Sn, Zn, ITO, an alloy thereof, or a combination thereof. In some other example embodiments, the second conductive layer 120P may include a metal layer and a conductive barrier layer covering at least a portion of the metal layer. The conductive barrier layer may include, for example, Ti, TiN, Ta, TaN, or a combination thereof, but is not limited to the examples.

Thereafter, a second preliminary upper electrode layer PTE2, a second preliminary selection device layer 154P, a second preliminary lower electrode layer PBE2, a second preliminary memory layer 152P, and a second preliminary heater electrode layer PHE2 may be sequentially stacked on the second conductive layer 120P, thereby forming a second stack structure CPS2 for forming a cross-point array.

The second preliminary upper electrode layer PTE2, the second preliminary selection device layer 154P, the first preliminary lower electrode layer PBE2, the second preliminary memory layer 152P, and the second preliminary heater electrode layer PHE2 may be formed in a manner similar or substantially similar to the first preliminary upper electrode layer PTE1, the first preliminary selection device layer 144P, the first preliminary lower electrode layer PBE1, the first preliminary memory layer 142P, and the first preliminary heater electrode layer PHE1 as described above.

Figure 16G:
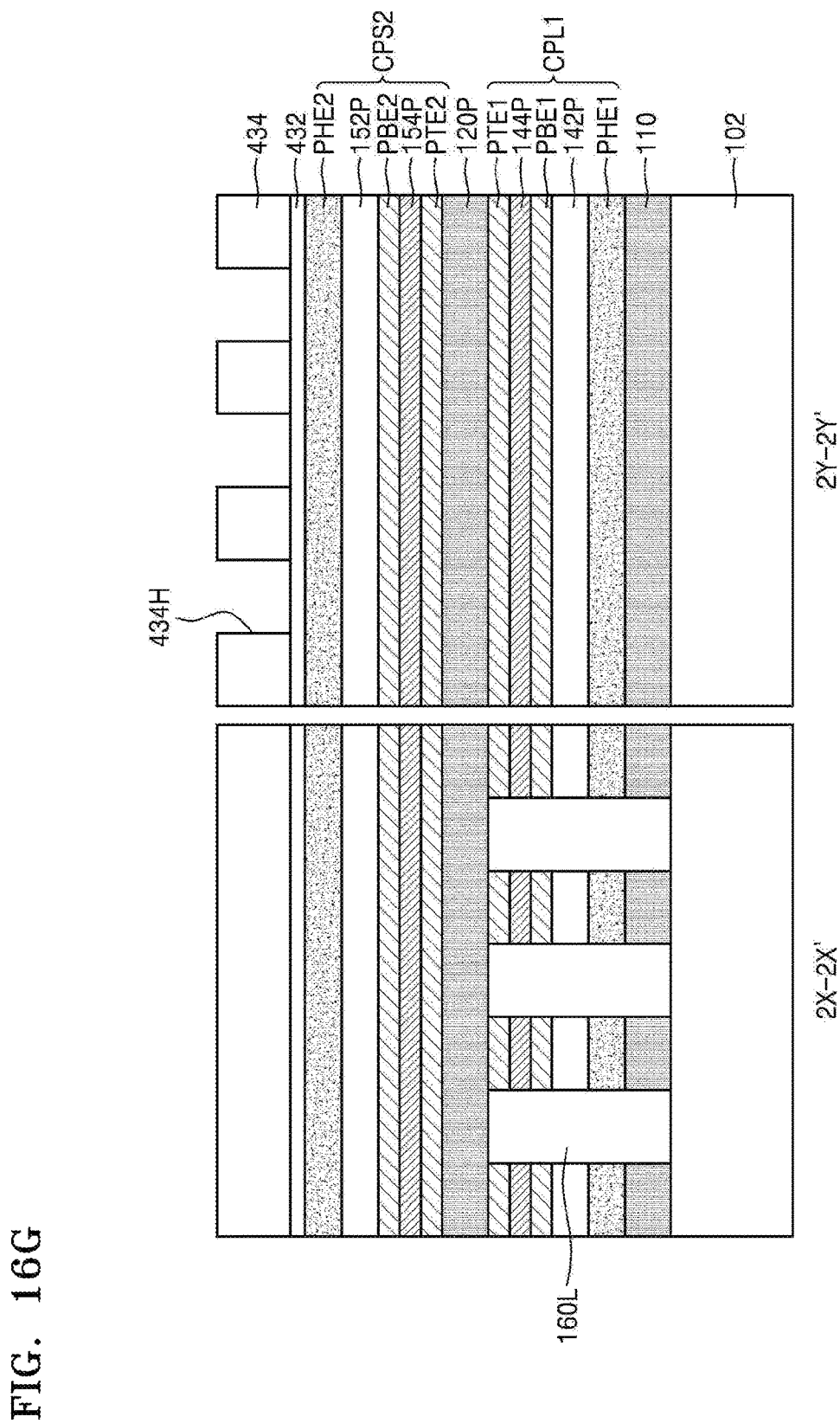

Referring to FIG. 16G, a sacrificial layer 432 may be formed on the second stack structure CPS2. In example embodiments, the sacrificial layer 432 may be formed by using a silicon nitride layer, but inventive concepts are not limited thereto.

Thereafter, a second mask pattern 434 may be formed on the sacrificial layer 432.

The second mask pattern 434 may include a plurality of openings 434H, which may extend parallel or substantially parallel to one another in a second direction (refer to Y direction in FIG. 2), and a plurality of line patterns, which may extend parallel or substantially parallel to one another in the second direction.

Referring to FIG. 16H, the sacrificial layer 432, the second stack structure CPS2, the second conductive layer 120P, and the plurality of first stack lines CPL1 may be sequentially anisotropically etched by using the second mask pattern 434 as an etch mask.

As a result, a plurality of sacrificial lines 432L, a plurality of second stack lines CP2, a plurality of common bit lines 120, a plurality of first stack patterns CPP1, and a plurality of second gaps G2 may be formed. The plurality of sacrificial lines 432L may extend parallel or substantially parallel to one another in the second direction (refer to Y direction in FIG. 2). The plurality of second stack lines CPL2 and the plurality of common bit lines 120 may extend in the second direction. The plurality of first stack patterns CPP1 may be formed apart from one another in the first direction (refer to X direction in FIG. 2) and the second direction. The plurality of second gaps G2 may extend parallel or substantially parallel to one another in the second direction between the plurality of second stack lines CPL2 and the plurality of common bit lines 120.

In example embodiments, the anisotropic etching process may be performed until top surfaces of the plurality of lower word lines 110 are exposed. Although not shown, recess portions (not shown) may be formed to a given (or, alternatively, desired or predetermined) thickness in upper portions of the plurality of lower word lines 110 due to the anisotropic etching process.

In other example embodiments, the anisotropic etching process may be performed until a top surface of the first preliminary heater electrode layer (refer to PHE1 in FIG. 16G) is exposed. Thereafter, portions of the first preliminary heater electrode layer PHE1, which are exposed within the plurality of second gaps G2, may be removed by using an etching process incorporating an etch recipe having an etch selectivity of the first preliminary heater electrode layer PHE1 with respect to the plurality of lower word lines 110 so that top surfaces of the plurality of lower word lines 110 may be exposed.

Figure 16I:
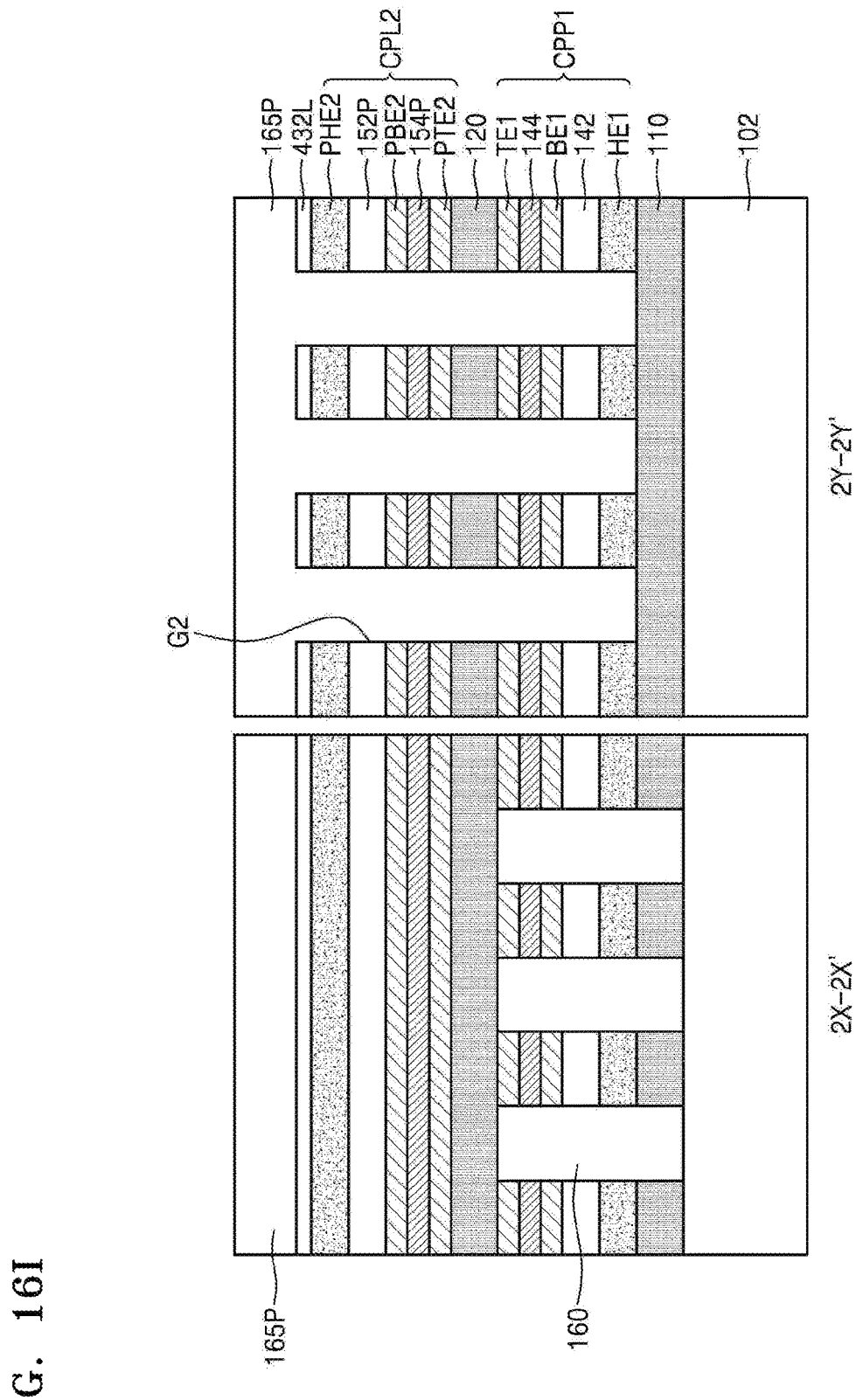

Referring to FIG. 16I, top surfaces of the plurality of sacrificial lines 432L may be exposed by removing the second mask pattern (refer to 434 in FIG. 16H), and each of the plurality of first gaps G2 may be filled with a second insulating layer 165P.

Figure 16J:
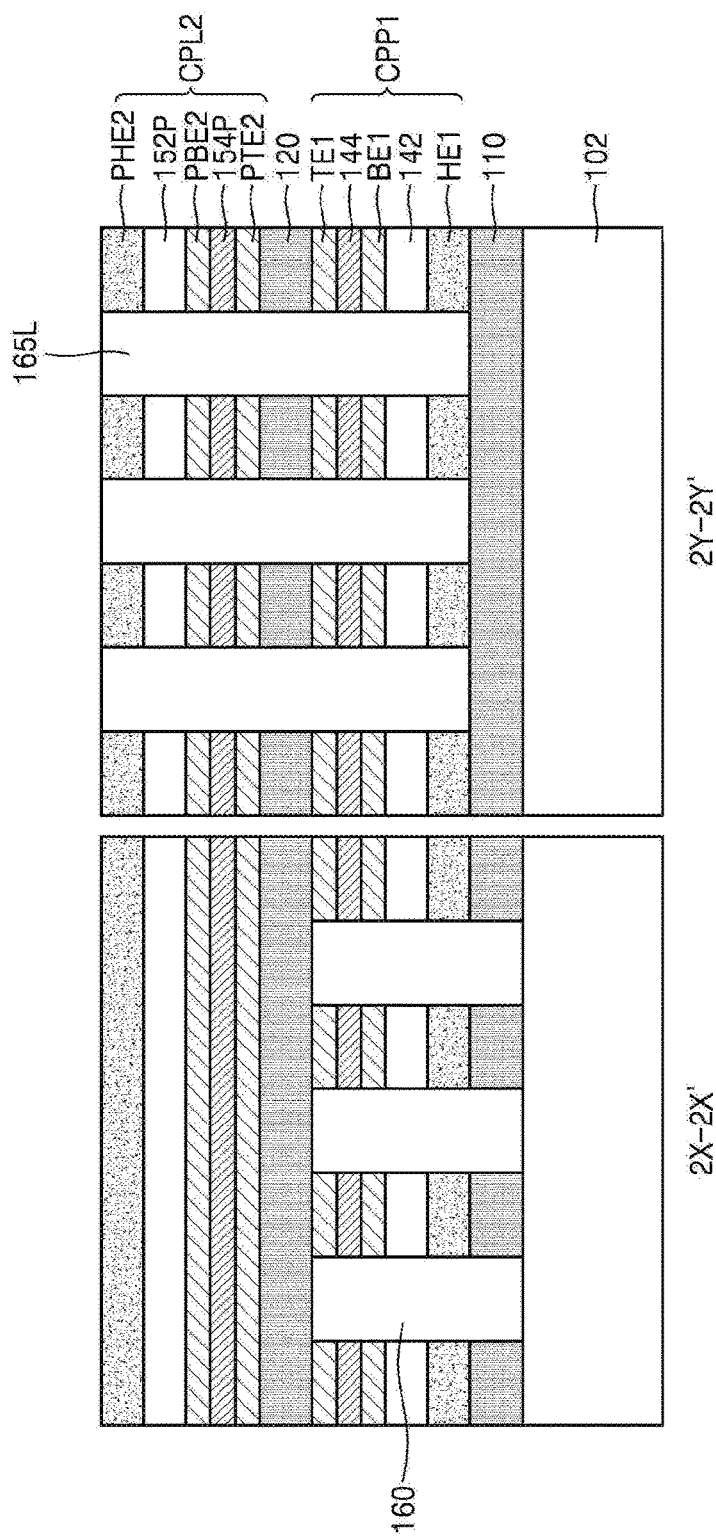

Referring to FIG. 16J, portions of the second insulating layer 165P on the plurality of sacrificial lines 432L may be removed by using an etch selectivity between the second insulating layer (refer to 165P in FIG. 16I) and the plurality of sacrificial lines 432L so that a plurality of second insulating lines 165L may remain within the plurality of second gaps G2.

Subsequently, the plurality of sacrificial lines 432L may be removed.

Figure 16K:
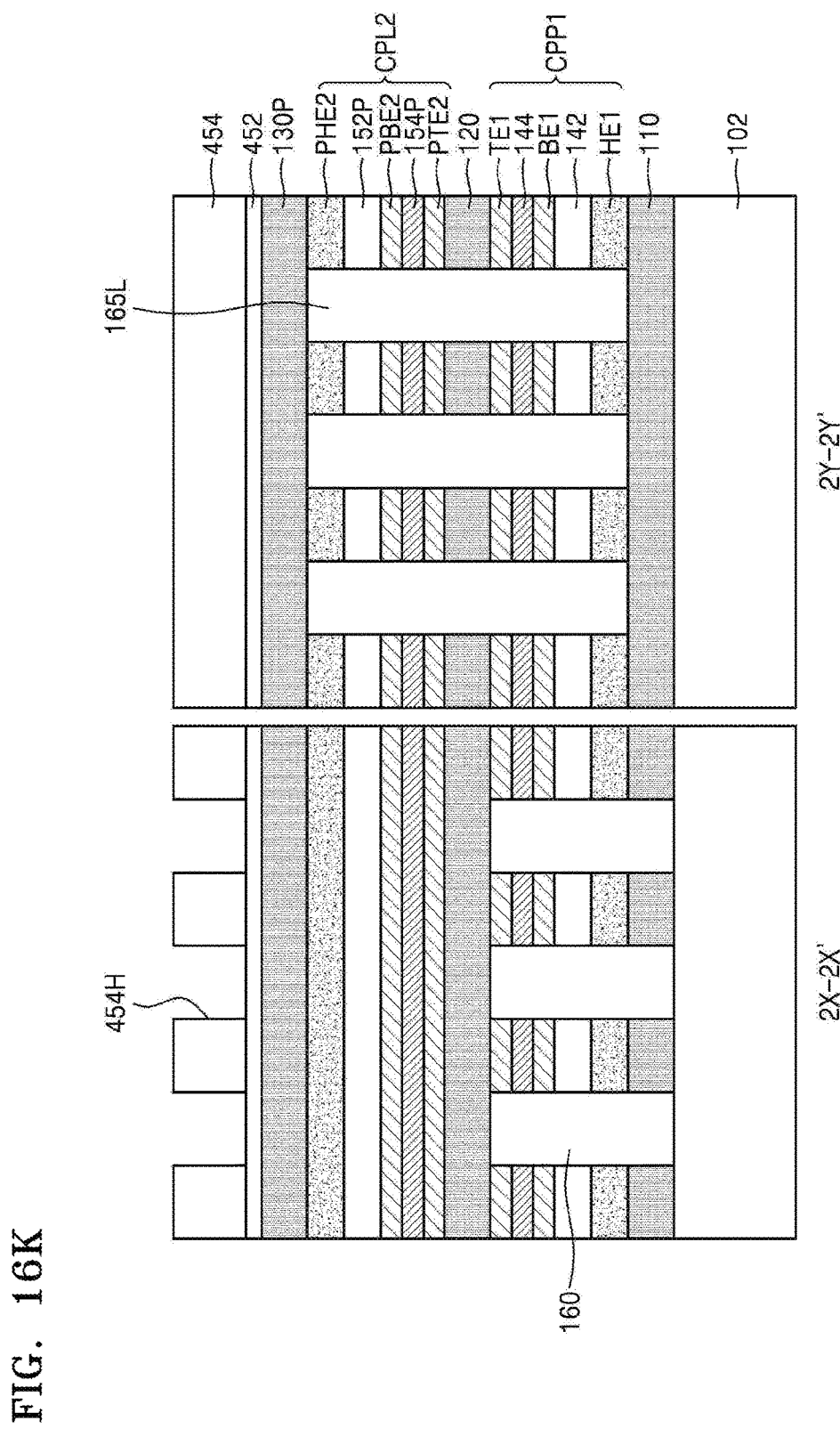

Referring to FIG. 16K, a third conductive layer 130P may be formed on the plurality of second stack lines CPL2 and the plurality of second insulating lines 165L.

In example embodiments, the third conductive layer 130P may include a metal, a conductive metal nitride, a conductive metal oxide, or a combination thereof. In some example embodiments, the third conductive layer 130P may include W, WN, Au, Ag, Cu, Al, TiAlN, Ir, Pt, Pd, Ru, Zr, Rh, Ni, Co, Cr, Sn, Zn, ITO, an alloy thereof, or a combination thereof. In some other example embodiments, the third conductive layer 130P may include a metal layer and a conductive barrier layer covering at least a portion of the metal layer. The conductive barrier layer may include, for example, Ti, TiN, Ta, TaN, or a combination thereof, but is not limited to the examples.

Thereafter, a sacrificial layer 452 may be formed on the third conductive layer 130P.

Afterwards, a third mask pattern 454 may be formed on the sacrificial layer 452. The third mask pattern 454 may include a plurality of openings 454H, which may extend parallel or substantially parallel to one another in the first direction (X direction), and a plurality of line patterns, which may extend parallel or substantially parallel to one another in the first direction.

Figure 16L:
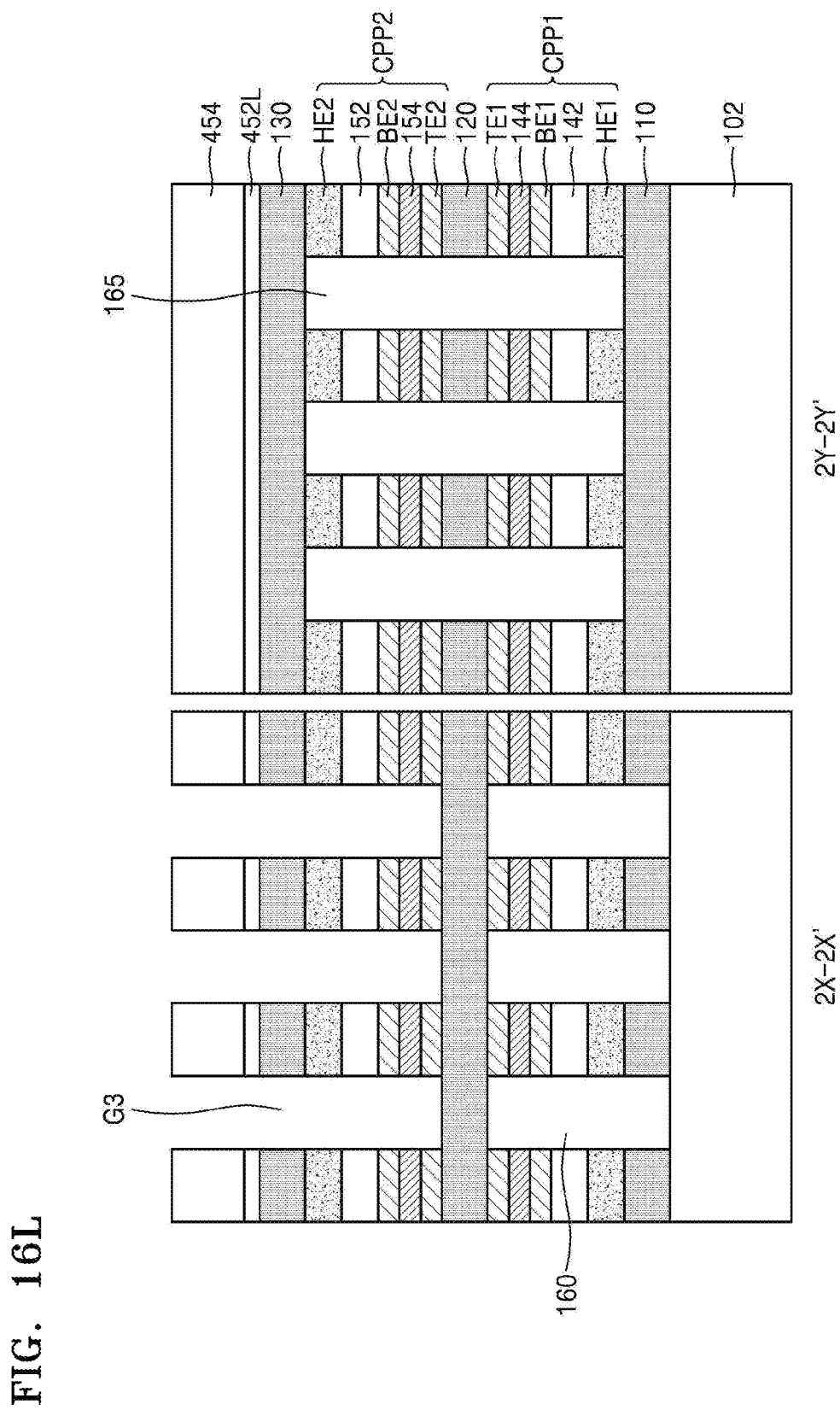

Referring to FIG. 16L, the sacrificial layer 452 and the plurality of second stack lines CPL2 may be sequentially anisotropically etched by using the third mask pattern 454 as an etch mask so that the third conductive layer 130P may be separated into a plurality of upper word lines 130 and each of the plurality of second stack lines CPL2 may be separated into a plurality of second stack patterns CPP2.

As a result, a plurality of sacrificial lines 452L may be formed and extend parallel or substantially parallel to one another in the first direction (refer to X direction in FIG. 2), and a plurality of second stack patterns CPP2 may be formed apart from one another in the first direction and the second direction. A plurality of third gaps G3 may be formed between the plurality of sacrificial lines 452L and the plurality of second stack patterns CPP2 and extend parallel or substantially parallel to one another in the first direction.

In example embodiments, the anisotropic etching process may be performed until top surfaces of the plurality of common bit lines 120 are exposed. Although not shown, recess portions (not shown) may be formed to a given (or, alternatively, desired or predetermined) thickness in upper portions of the plurality of common bit lines 120 due to the anisotropic etching process.

In other example embodiments, the anisotropic etching process may be performed until a top surface of the second preliminary upper electrode layer PTE2 is exposed. Thereafter, portions of the second preliminary upper electrode layer PTE2, which are exposed within the plurality of third gaps G3, may be removed by using an etching process incorporating an etch recipe having an etch selectivity of the second preliminary upper electrode layer PTE2 with respect to the plurality of common bit lines 120 so that top surfaces of the plurality of common bit lines 120 may be exposed.

Figure 16M:
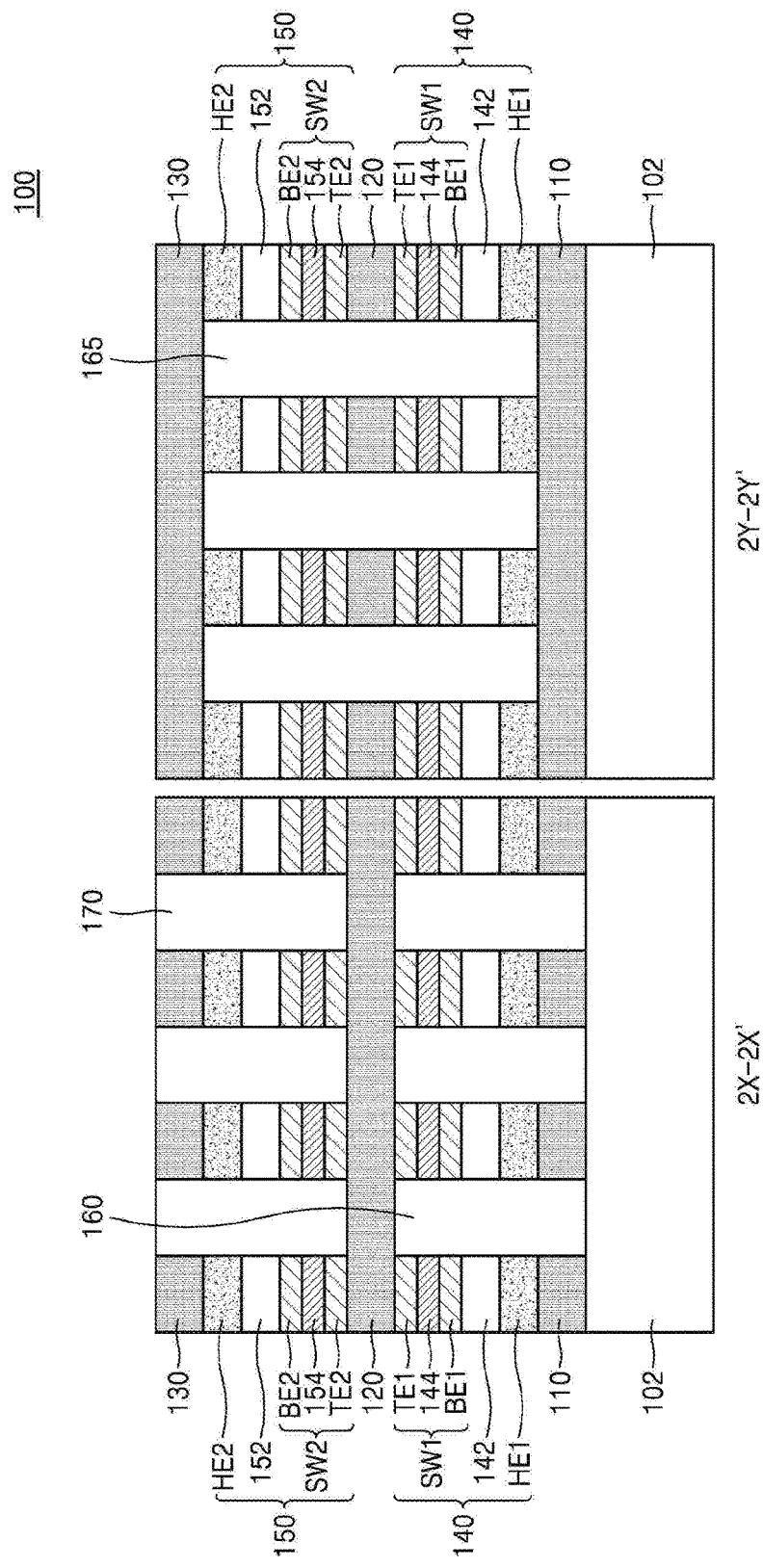

Referring to FIG. 16M, top surfaces of the plurality of sacrificial lines (refer to 452L in FIG. 16L) may be exposed by removing the third mask pattern (refer to 454 in FIG. 16L).

Thereafter, each of the plurality of third gaps G3 may be filled with a third insulating layer (not shown), and portions of the third insulating layer on the plurality of sacrificial lines 452L may be removed by using an etch selectivity between the third insulating layer and the plurality of sacrificial lines 452L so that a plurality of third insulating lines 170 may remain within the plurality of third gaps G3.

Thereafter, the plurality of sacrificial lines 452L may be removed.

The above-described processes may be performed, thereby completing the manufacture of the memory device 100.

In one or more example embodiments of a method of manufacturing the memory device 100, a patterning operation using the first mask pattern 414 extending in the first direction, a patterning operation using the second mask pattern 434 extending in the second direction, and a patterning operation using the third mask pattern 454 extending in the first direction may be sequentially performed. As a result, a plurality of lower word lines 110, a plurality of common bit lines 120, a plurality of first memory cell pillars 140, a plurality of upper word lines 130, and a plurality of second memory cell pillars 150 may be formed. The plurality of lower word lines 110 may extend in the first direction, and the plurality of common bit lines 120 may extend in the second direction. The plurality of first memory cell pillars 140 may be respectively located at a plurality of intersections between the plurality of lower word lines 110 and the plurality of common bit lines 120, and the plurality of upper word lines 130 may extend in the first direction.

The plurality of second memory cell pillars 150 may be respectively located at a plurality of intersections between the plurality of common bit lines 120 and the plurality of upper word lines 130.

In one or more example embodiments of a method of manufacturing the memory device 100, the plurality of first memory cell pillars 140 and the plurality of second memory cell pillars 150 may be formed by using only three photolithography patterning operations. Thus, degradation of and/or damage to the memory layers 142 and 152 and/or the selection device layers 144 and 154 may be suppressed and/or prevented when the memory layers 142 and 152 and/or the selection device layers 144 and 154 are exposed to an etching atmosphere during a patterning process. Also, manufacturing costs of the memory device 100 may be reduced.

In the processes described with reference to FIGS. 16A and 16F, when layers included in the first and second stack structures CPS1 and CPS2 are formed in a different order from that described above, the memory device 100A described with reference to FIG. 7 may be manufactured.

For example, the first stack structure CPS1 may be formed by sequentially forming a first preliminary lower electrode layer PBE1, a first preliminary selection device layer 144P, a first preliminary upper electrode layer PTE1, a first preliminary memory layer 142P, and a first preliminary heater electrode layer PHE1. A second stack structure CPS2 may be formed by sequentially forming a first second preliminary heater electrode layer PHE2, a second preliminary memory layer 152P, a second preliminary upper electrode layer PTE2, a first preliminary selection device layer 154P, and a first preliminary lower electrode layer PBE1.

Also, in the processes described with reference to FIG. 16A, unlike described above, a mold layer (not shown) having a line shape may be formed on the first conductive layer 110P and extend in a first direction (X direction), and a first preliminary heater electrode layer (not shown) may be conformally formed to a given (or, alternatively, desired or predetermined) thickness on a sidewall of the mold layer and the first conductive layer 110P. Thereafter, when the first preliminary heater electrode layer is anisotropically etched, only a portion of the first preliminary heater electrode layer formed on the sidewall of the mold layer may remain so that a first heater electrode HE1A having an I-shaped vertical section may be formed. A second heater electrode HE2A may also be formed in a manner similar or substantially similar to the first heater electrode HE1A. Thus, the memory device 100B described with reference to FIG. 8 may be manufactured.

Furthermore, in the processes described with reference to FIG. 16A, unlike described above, a mold layer (not shown) having a line shape may be formed on the first conductive layer 110P and extend in the first direction (X direction), and a first preliminary heater electrode layer (not shown) may be conformally formed to a given (or, alternatively, desired or predetermined) thickness on a sidewall of the mold layer and the first conductive layer 110P. Thereafter, a process of forming a spacer layer (not shown) and an anisotropic etching process may be performed on the first preliminary heater electrode layer, thereby forming a spacer SP1. When the first preliminary heater electrode layer is anisotropically etched, portions of the first preliminary heater electrode layer formed on the sidewall of the mold layer and the first conductive layer 110P may remain so that a first heater electrode HE1A having an L-shaped vertical section may be formed. In this case, the memory device 100C described with reference to FIG. 9 may be manufactured.

In addition, in the process described with reference to FIG. 16A, unlike described above, a mold layer (not shown) having a line shape may be formed on the first conductive layer 110P and extend in the first direction (X direction), and both sidewalls of the mold layer may be conformally covered with an insulating layer (not shown). When the insulating layer is anisotropically etched, two first insulating patterns IL3 having inclined sidewalls may be formed. Thereafter, a space defined between the two first insulating patterns IL3 may be filled with a first preliminary memory layer (not shown), and an upper portion of the first preliminary memory layer may be polished to form a damascene-type first memory layer 142A. In this case, the memory device 100E described with reference to FIG. 11 may be manufactured.

After the process described with reference to FIG. 16M is performed, an insulating layer 180 may be formed on the resultant structure, and the processes described with reference to FIGS. 16A to 16M may be performed again on the insulating layer 180, thereby completing the manufacture of the memory device 200 described with reference to FIGS. 13 to 15.

While inventive concepts have been particularly shown and described with reference to example embodiments thereof, it will be understood that various changes in form and details may be made therein without departing from the spirit and scope of the following claims.

What is claimed is:

1. A memory device comprising:
a plurality of lower word lines on a substrate, the plurality of lower word lines extending in a first direction parallel to a top surface of the substrate;
a plurality of common bit lines on the plurality of lower word lines, the plurality of common bit lines extending in a second direction parallel to the top surface of the substrate, the second direction different from the first direction;
a plurality of upper word lines on the plurality of common bit lines, the plurality of upper word lines extending in the first direction;
a plurality of first memory cell structures at intersections between the plurality of lower word lines and the plurality of common bit lines, each of the plurality of first memory cell structures including a first memory layer and a first selection device, the first selection device having ovonic threshold switching (OTS) characteristics; and
a plurality of second memory cell structures at intersections between the plurality of upper word lines and the plurality of common bit lines, each of the plurality of second memory cell structures including a second memory layer and a second selection device, the second selection device having OTS characteristics,
wherein
the plurality of first memory cell structures have structures symmetrical to structures of the plurality of second memory cell structures with respect to the plurality of common bit lines in a third direction,
the third direction perpendicular to the first direction,
the first and second memory layers are configured to store data, and
a sidewall of a first of the plurality of first memory cell structures, a sidewall of a first of the second memory cell structures, and a sidewall of a first of the plurality of common bit lines are self-aligned.

2. The memory device of claim 1, wherein
each of the plurality of first memory cell structures further includes a first heater electrode;
the first memory layer is between the first heater electrode and the first selection device;
each of the plurality of second memory cell structures further includes a second heater electrode; and
the second memory layer is between the second heater electrode and the second selection device.

3. The memory device of claim 2, wherein
the first heater electrode does not contact the first selection device; and
the second heater electrode does not contact the second selection device.

4. A memory device comprising:
a plurality of first lower word lines on a substrate, the plurality of first lower word lines extending in a first direction parallel to a top surface of the substrate;
a plurality of first common bit lines on the plurality of first lower word lines, the plurality of first common bit lines extending in a second direction parallel to the top surface of the substrate, the second direction different from the first direction;
a plurality of first upper word lines on the plurality of first common bit lines, the plurality of first upper word lines extending in the first direction;
a plurality of first memory cell structures at intersections between the plurality of first lower word lines and the plurality of first common bit lines, each of the plurality of first memory cell structures including a first memory layer and a first selection device, the first selection device having ovonic threshold switching (OTS) characteristics; and
a plurality of second memory cell structures at intersections between the plurality of first upper word lines and the plurality of first common bit lines, each of the plurality of second memory cell structures including a second memory layer and a second selection device, the second selection device having OTS characteristics, wherein
the plurality of first memory cell structures have structures symmetrical to structures of the plurality of second memory cell structures with respect to the plurality of first common bit lines in a third direction,
the third direction is perpendicular to the first direction,
the first and second memory layers are configured to store data,
a first sidewall of a first of the plurality of first memory cell structures, a first sidewall of a first of the plurality of second memory cell structures and a first longitudinal sidewall of a first of the plurality of first common bit lines are self-aligned, and
a second sidewall of the first of the plurality of first memory cell structures is aligned with a longitudinal sidewall of a first of the plurality of first lower word lines.

5. The memory device of claim 4, wherein
a first sidewall of a first selection device among the first selection devices is aligned with a longitudinal sidewall of a first of the plurality of first lower word lines; and
a second sidewall of the first selection device among the first selection devices is aligned with a longitudinal sidewall of a first of the plurality of first common bit lines.

6. The memory device of claim 4, wherein
a first sidewall of a second selection device among the second selection devices is aligned with a longitudinal sidewall of a first of the plurality of first upper word lines; and
a second sidewall of the second selection device among the second selection devices is aligned with a longitudinal sidewall of a first of the plurality of first common bit lines.

7. The memory device of claim 4, wherein
each of the plurality of first memory cell structures further includes a first heater electrode;
the first memory layer is between the first heater electrode and the first selection device;
each of the plurality of second memory cell structures further includes a second heater electrode; and
the second memory layer is between the second heater electrode and the second selection device.

8. The memory device of claim 4, further comprising:
a plurality of second lower word lines on the plurality of first upper word lines, the plurality of second lower word lines extending in the first direction;
a plurality of second common bit lines on the plurality of second lower word lines, the plurality of second common bit lines extending in the second direction;
a plurality of second upper word lines on the plurality of second common bit lines, the plurality of second upper word lines extending in the first direction;
a plurality of third memory cell structures at intersections between the plurality of second lower word lines and the plurality of second common bit lines, each of the plurality of third memory cell structures having a third memory layer and a third selection device, the third selection device having OTS characteristics; and
a plurality of fourth memory cell structures at intersections between the plurality of second upper word lines and the plurality of second common bit lines, each of the plurality of fourth memory cell structures including a fourth memory layer and a fourth selection device, the fourth selection device having OTS characteristics.

9. A semiconductor device comprising:
a first memory cell having a first stack structure including a first memory layer between a first heater electrode and a first ovonic threshold switching device;
a bit line on the first memory cell; and
a second memory cell on the bit line, the second memory cell having a second stack structure including a second memory layer between a second ovonic threshold switching device and a second heater electrode, the first and second stack structures being symmetrical with respect to the bit line,
wherein a sidewall of the first memory cell, the second memory cell structures, and the bit line is self-aligned, and
the first and second memory layers are configured to store data.

10. The semiconductor device of claim 9, wherein
the first stack structure is a vertical stack structure;
the first memory layer is on the first heater electrode; and
the first ovonic threshold switching device is on the first memory layer and contacts the bit line.

11. The semiconductor device of claim 10, wherein
the second stack structure is a vertical stack structure;
the second ovonic threshold switching device contacts the bit line;

the second memory layer is on the second ovonic threshold switching device; and the second heater electrode is on the second memory layer.

12. The semiconductor device of claim 9, wherein the first stack structure is a vertical stack structure;

the first memory layer is on the first ovonic threshold switching device; and the first heater electrode is on the first memory layer and contacts the bit line.

13. The semiconductor device of claim 12, wherein the second stack structure is a vertical stack structure;

the second heater electrode contacts the bit line;

the second memory layer is on the second heater electrode; and the second ovonic threshold switching device is on the second memory layer.

14. The semiconductor device of claim 9, further comprising:

a first word line connected to the first heater electrode; and a second word line connected to the second heater electrode.

15. The semiconductor device of claim 9, wherein the first memory layer is a first phase-change material layer; and the first heater electrode is configured to heat the first phase-change material layer to change a phase of the first phase-change material layer.

16. The semiconductor device of claim 15, wherein the second memory layer is a second phase-change material layer; and the second heater electrode is configured to heat the second phase-change material layer to change a phase of the second phase-change material layer.

17. The semiconductor device of claim 9, wherein the first memory layer separates the first heater electrode from the first ovonic threshold switching device such that the first heater electrode does not contact the first ovonic threshold switching device.

18. The semiconductor device of claim 17, wherein the second memory layer separates the second heater electrode from the second ovonic threshold switching device such that the second heater electrode does not contact the second ovonic threshold switching device.

* * * * *